United States Patent
Hibbs et al.

(10) Patent No.: US 10,082,546 B2
(45) Date of Patent: Sep. 25, 2018

(54) COMPACT UNDERWATER ELECTROMAGNETIC MEASUREMENT SYSTEM USING MAGNETIC SENSORS AND ELECTRICAL SENSORS HAVING CAPACITIVE ELECTRODES

(75) Inventors: Andrew D. Hibbs, La Jolla, CA (US); Thomas Kurt Nielsen, Oceanside, CA (US)

(73) Assignee: Quasar Federal Systems, San Diego, CA (US)

( * ) Notice: Subject to any disclaimer, the term of this patent is extended or adjusted under 35 U.S.C. 154(b) by 2494 days.

(21) Appl. No.: 12/000,234

(22) Filed: Dec. 11, 2007

(65) Prior Publication Data

US 2008/0246485 A1 Oct. 9, 2008

Related U.S. Application Data

(60) Provisional application No. 60/874,184, filed on Dec. 11, 2006.

(51) Int. Cl.
*G01V 3/02* (2006.01)
*G01R 33/12* (2006.01)
(Continued)

(52) U.S. Cl.
CPC ......... *G01R 33/12* (2013.01); *G01R 29/0871* (2013.01); *G01R 33/04* (2013.01);
(Continued)

(58) Field of Classification Search
CPC ... G01V 3/02; G01V 3/04; G01V 3/06; G01V 3/08; G01V 3/081; G01V 3/082; G01V 3/083; G01V 3/087; G01V 3/088; G01V 3/10; G01V 3/101; G01V 3/102; G01V 3/104; G01V 3/105; G01V 3/107;
(Continued)

(56) References Cited

U.S. PATENT DOCUMENTS 2,872,638 A * 2/1959 Jones ........................... 324/365
3,343,415 A 9/1967 Johnston
(Continued)

FOREIGN PATENT DOCUMENTS

EP 338400 10/1989
WO 2000/0062048 10/2000

OTHER PUBLICATIONS

"*The Fundamentals of Electrochemistry*", pp. 178, V.S. Bagotsky, 2006.

*Primary Examiner* — David M. Schindler
(74) *Attorney, Agent, or Firm* — Diederiks & Whitelaw, PLC

(57) ABSTRACT

An underwater EM measurement system, which is substantially smaller, much simpler to use, and more robust than prior systems, is formed as a sensor package integrated into a single pressure vessel includes two magnetic sensors including induction coils disposed substantially horizontally so as to measure fields in orthogonal directions. The package also includes two electric field sensors including electric potential antennas adapted to couple to a water potential via a capacitive electrode having a conducting material and an electrically insulative layer formed of an insulating material. The capacitive electrode has a capacitance to the medium of greater than 1 mF. Preferably, the insulating material is a metal oxide.

24 Claims, 13 Drawing Sheets

(51) Int. Cl.
 *G01V 3/08* (2006.01)
 *G01R 33/04* (2006.01)
 *G01R 33/10* (2006.01)
 *G01R 29/08* (2006.01)

(52) U.S. Cl.
 CPC ............... *G01R 33/10* (2013.01); *G01V 3/02* (2013.01); *G01V 3/08* (2013.01); *G01V 3/083* (2013.01); *H03F 2200/261* (2013.01); *H03F 2203/45138* (2013.01); *Y02A 90/344* (2018.01)

(58) Field of Classification Search
 CPC .......... G01V 3/108; G01V 3/15; G01V 3/165; G01V 3/36; G01V 3/38; G01V 3/40; G01R 33/02; G01R 33/0206; G01R 33/022; G01R 33/04; G01R 33/045; G01R 33/06; G01R 33/12; G01R 33/1253
 USPC ........................................ 324/365
 See application file for complete search history.

(56) References Cited

U.S. PATENT DOCUMENTS

| | | | |
|---|---|---|---|
| 3,552,209 A | 1/1971 | Johnston | |
| 3,593,118 A * | 7/1971 | Chaney et al. | 324/442 |
| 4,282,487 A | 8/1981 | Warren et al. | |
| 4,511,948 A | 4/1985 | Maltby et al. | |
| 4,728,882 A * | 3/1988 | Stanbro et al. | 324/687 |
| 4,757,252 A | 7/1988 | Maltby et al. | |
| 5,206,640 A | 4/1993 | Hirvonen et al. | |
| 5,770,945 A | 6/1998 | Constable | |
| 6,078,729 A | 6/2000 | Kopel | |
| 6,424,222 B1 | 7/2002 | Jeong et al. | |
| 6,457,355 B1 | 10/2002 | Philipp | |
| 6,512,356 B1 | 1/2003 | Webb | |
| 6,686,800 B2 | 2/2004 | Krupka | |
| 6,842,006 B2 | 1/2005 | Conti et al. | |
| 7,088,175 B2 | 8/2006 | Krupka | |
| 7,141,968 B2 | 11/2006 | Hibbs et al. | |
| 7,141,987 B2 * | 11/2006 | Hibbs et al. | 324/658 |
| 7,189,312 B2 * | 3/2007 | Watson et al. | 204/196.36 |
| 7,208,077 B1 | 4/2007 | Albers et al. | |
| 2002/0006739 A1 | 1/2002 | Yamamoto | |
| 2003/0054636 A1 | 3/2003 | Tsuneda et al. | |
| 2005/0073302 A1 * | 4/2005 | Hibbs et al. | 324/247 |
| 2006/0226842 A1 | 10/2006 | Conti et al. | |
| 2007/0018650 A1 | 1/2007 | Bhansali et al. | |
| 2007/0034529 A1 | 2/2007 | Bard et al. | |
| 2007/0118197 A1 | 5/2007 | Loeb | |
| 2008/0122424 A1 * | 5/2008 | Zhang et al. | 324/72 |

* cited by examiner

ORTHOGONAL SEPARATION, S, BETWEEN COIL CENTERS

COMPACT UNDERWATER ELECTROMAGNETIC MEASUREMENT SYSTEM USING MAGNETIC SENSORS AND ELECTRICAL SENSORS HAVING CAPACITIVE ELECTRODES

CROSS-REFERENCE TO RELATED APPLICATIONS

The present application claims the benefit of U.S. Provisional Patent Application Ser. No. 60/874,184 entitled "Use of Capacitive Electrodes for Underwater Electric Field Measurement" filed Dec. 11, 2006.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Navy SBIR Phase I: N68335-05-C-0242 and Navy SBIR Phase II: N68335-07-C-0135.

BACKGROUND OF THE INVENTION

The present invention pertains to the art of measuring electric and magnetic fields in a conducting medium. In particular, the invention applies to a system and method to determine the electrical resistivity of the seafloor, and most particularly to offshore hydrocarbon exploration.

Various techniques require measurement of electric and magnetic fields underwater and in particular at the sea floor. The measurement of magnetotelluric fields and controlled-source electromagnetic (CSEM) sounding are examples. Present systems to perform these measurements are comprised of a series of independent sensors and data recording modules connected to a common frame. An example of a magnetotelluric measurement system built according to U.S. Pat. No. 5,770,945, incorporated herein by reference, and used in commercial hydrocarbon exploration, is shown in FIG. 1.

As illustrated, the magnetotelluric measurement system for seafloor oil exploration is roughly grouped into four units. A first unit, a logger unit, includes a 4-channel digital data logging processor 104, magnetic field post amplifier, electric field amplifiers, all contained within a first waterproof pressure case 112. A second unit is a second waterproof pressure case 114 containing an acoustic navigation/release system 116. A third unit consists of four silver/silver-chloride (Ag—AgCl) electrodes 118-121 mounted on the ends of 5-meter long booms 139-142. A fourth unit includes magnetic induction coil sensors 122, 124. (Note that a third magnetic sensor can be used to measure the vertical magnetic field, but is not illustrated.) Each of the elements of the system are mounted on a corrosion-resistant plastic and aluminum frame 102 along with glass spheres 126 for flotation and an anchor 128 for deployment to the seafloor.

The size and operational methodology of prior art underwater EM measurement systems such as the one shown in FIG. 1 have been driven by: a) the need for a large separation between the electrodes used in the electric field sensors; and b) the need to store the electrodes in water prior to deployment into the ocean. The result is a cumbersome system with sensing arms longer than 10 meters and sensors that must be installed into the system on the deck of a ship, just prior to deployment. Putting together so sensitive a system on the deck of a ship is a difficult task that reduces the overall reliability of the measurement system when deployed. In particular, there are a number of discrete modules interfaced by connectors that have the potential to leak and be exposed to seawater, thereby raising the risk of corrosion potentials in the sensing circuit, and in general there is a risk of damaging connector pins.

The fundamental limitation in present underwater electrodes is their requirement to exchange ions with the seawater in order to provide a real (i.e. DC) electrical current path between a first stage amplifier and the ocean. The actual process by which current passes from an electrode into the medium can be complex, involving direct tunneling of electrons between the electrode and medium, chemical reaction to transfer electrons from/to ions in the medium, and catalysis of chemical reaction in the medium at the electrode surface and associated charge transfer to the electrode. These processes are typically accompanied by the diffusion and field-induced motion of ions in the medium to carry the current away from the electrode. In this document, such current conduction mechanisms are referred to as "resistive," though the actual process is much more complex, and will often not conform to Ohm's law. For a resistive current to flow, the medium must be a fluid or solid environment which can couple to an electrode in a resistive manner, no matter how weakly, such as seawater, soil, or suitable compliant rock (e.g. sand).

These chemical reactions and associated diffusion-driven effects mean that resistively coupled electrodes have an inherent settling time and associated level of low frequency electrical noise. The ionic boundary layers and concentration gradients typically take times on the order of 10 minutes to reach equilibrium. In addition, there is a small DC potential difference associated with this equilibrium that depends on the manufacture and usage history of the electrode. Small variations in this DC potential due to effects such as temperature changes or variations in the local chemical environment (e.g. salinity) lead to an increase in the electrode measurement noise at low frequency. In a shallow water environment, the inevitable stirring of the solution will impede this equilibrium, thereby changing the DC potential and increasing noise. In order to minimize these effects, resistive electrodes are generally made as large as practical so that their electrical resistance to the medium is as small as possible. However, even at their largest practical size (~30 cm long), the noise from electrodes is often the limiting factor in the system performance. Further, the chemical processes mean that existing resistive electrodes must remain wet at all times to function at their optimum level.

In other applications, electrodes that do not require coupling to the medium in a resistive manner have been developed. Such electrodes have a primarily capacitive interaction with the medium, in which they couple directly to the electric potential at a given point in the medium via the rate of change of the local electric flux density. In capacitive coupling, an image charge flows to the electrode to neutralize its electrostatic energy relative to the medium and this charge creates an equal and opposite charge in the input of the readout apparatus. The coupling is primarily capacitive because in practice there is no perfect electrical insulator, and in contacting any medium a small, but non zero resistive current will flow.

The majority of primarily capacitive electrodes have been developed to measure signals that originate in the human body, or are implanted in order to apply signals to stimulate the body. An example of the former is capacitive electrodes that work on the skin and/or just off the skin. The aim of such measurements is to avoid the use of the conducting gels that are used in conjunction with resistive electrodes in order to reduce the impedance of the outer layer of the skin from a resistance greater than 100 kΩ to less than 10 kΩ. The capacitance of skin contacting electrodes is on the order of 0.1-100 nF, resulting in a system noise with a well designed amplifier on the order of 1 μVrms. This noise level is comparable to the skin noise of the human body and is adequate to record cardiac and brain signals.

In the latter case of implanted stimulating electrodes, the concern is to prevent a DC current flow which could lead to a build-up of electrolysis products that can be toxic to tissue. Traditionally, a capacitor is placed in series with a resistive electrode in order to block such DC current. To reduce the overall system size, a capacitive electrode is sometimes used to remove the need for the series capacitor. To apply a stimulus pulse to the cerebral cortex or to the cochlea requires current pulses on the order of 5 mA for a duration on the order of 1 millisecond. This can easily be provided by an electrode with capacitance to the medium on the order of 1 μF, and an applied voltage on the order of 5 V. When properly constructed, a capacitive stimulating electrode of this type has a size on the order of 1 mm in diameter and 0.25 mm in thickness. In some applications, the stimulating electrodes are used to receive signals in the range 100 μV in amplitude and 2 to 70 Hz in frequency that are indicative of electromechanical body activity such as tremors, akinesia and rigidity that might signify a modification in treatment is needed. However, at 1 Hz the impedance of a stimulating electrode of this type is on the order of 200 kΩ. When used with a state-of-the-art preamplifier with input current noise of 1 pA, such an electrode has an rms voltage noise over the range 2 Hz to 70 Hz of at least 3 μV, which is on the order of 100 times higher than existing underwater resistive-based electrode measurement systems.

A recently developed type of sensor makes capacitive coupling to the air. In this case it is not possible to make a usable resistive contact to the air and a capacitive coupling is the only option. However, the achievable capacitance to the air is very small, on the order of 1 pF (i.e. 1000 times less than for skin contacting electrodes and 1 million times smaller than for stimulating electrodes). The resulting noise level at 1 Hz is on the order of 100 μV, again far higher than existing underwater resistive-based electrode measurement systems.

Thus, although capacitive electrodes offer a way to measure electrical potentials without electrochemical reactions with the medium, prior capacitive electrodes systems have been considerably noisier than what can be achieved by existing underwater resistive electrodes. Further, even if all noise associated with present capacitive coupling could be removed, there would still be the possibility of electrochemical noise with a nominally capacitive electrode. Indeed, because of their comparably high internal noise, the presence of electrochemical noise between the electrode and the medium has not previously been a design consideration in capacitive electric field measurement systems.

Based on the above, there exists a need for a compact underwater electromagnetic measurement system that can be stored on a ship and moved into the water in a fully assembled form without disconnecting or adding sensor elements. Further, there exists a need for a measurement system that can confirm its general functionality prior to deployment into the ocean, and then confirm to a high level of accuracy its full operating performance when on the sea floor. One application of significant commercial and research interest is the field of underwater magnetotellurics and CSEM sounding, in which electric and magnetic field measurements are made at a number of locations, allowing the conductivity of the underlying geology to be inferred.

SUMMARY OF THE INVENTION

It is an object of the present invention to provide an electromagnetic measurement system that is much more compact, and easier to use than systems used in the prior art. A preferred embodiment of the present invention is directed to a system for measuring magnetic and electric fields in an electrically conducting medium having an electric potential. The system comprises a sensor package integrated into a single pressure vessel, combined with ancillary systems for deploying and retrieving it.

The sensor package includes at least two magnetic field sensors. Each magnetic field sensor has a magnetic field induction coil for producing a magnetic field signal and a magnetic field signal amplifier connected to the induction coil for producing an amplified magnetic field signal based on the induction coil output. The induction coils are disposed substantially orthogonally and horizontally so as to measure at least the fields in a horizontal plane. The package also includes at least two electric field sensors. Each electric field sensor receives an input from at least two electric potential antennas and produces an electric field signal by amplifying and differencing the signals from the electric potential antennas. The electric field antennas are also disposed substantially horizontally so as to measure fields in orthogonal directions. Preferably, a third magnetic field induction coil and an fifth electric potential antenna are mounted above the plane containing the horizontally oriented sensors in order to measure the electric and magnetic fields in the vertical direction.

The electric potential antennas couple to the water potential via a capacitive electrode having a conducting core and an electrically insulative layer covering the core. The insulative layer prevents transfer of a resistive current from the core to the water, thereby minimizing electrochemical oxidation and reduction reactions between the conducting core and the medium. The capacitive electrode has a capacitance to the water of greater than 1 mF in the capacitive regime from 0.1 Hz to 10 Hz. Preferably, the insulative layer is a metal oxide. The electric field signal amplifier input bias circuits are configured to minimize the flow of DC current between the electrodes and the medium, and DC electrical isolation is used between the amplifiers, recording circuitry and other system elements to minimize the DC potential difference between the electrode and the medium and thereby further minimize electrochemical reactions at the electrode.

Magnetic source coils and local voltage-driven conductors create calibration magnetic and electric fields that are measured by the induction coils and electric potential antennas, respectively. A data logging processor receives the amplified electric field signals and amplified magnetic field signals and stores data representative thereof. A clocking device synchronizes operation of the data logging processor with other data logging processors. A power supply provides electrical power to the data logging processor, electric sensors and the magnetic sensors.

Data output is provided via a high speed digital link. Using such a link removes the need to open the pressure case to remove data storage media. The data link is provided by a wired connector, via a wireless link operating through an RF-transparent window in the pressure vessel, or via a small antenna external to the pressure vessel. Similarly, the system's batteries are recharged while in place inside the pressure vessel, rather than being removed for recharging or replacement. Power is preferably provided by a wired connector or via an inductively coupled port. In the case when wired connections are used, the connections are protected from the high pressure environment by using a pressure cap assembly familiar to those skilled in the art.

The pressure housing and sensors are preferably attached to a structure that allows connection of an anchor for deploying the system on the sea floor, and a flotation device for its subsequent recovery. In a particularly efficient design, the flotation device itself serves as the structure. Other items are connected to the structure as desired, including, but not limited to, a sensor unit to determine orientation and tilt, as well as an acoustic transponder system.

By these design innovations, the resulting underwater EM measurement system is substantially smaller, much simpler to use, and more robust than prior systems. The reduction in size translates to a substantial reduction in weight and cost of the pressure vessel components, and a related reduction in the cost of ancillary systems such as flotation devices and deployment and recovery equipment. Further, the reduction in size enables many more systems to be carried by the survey ship, or for the systems to be deployed directly on the seabed by remotely operated vehicles, which eliminates the placement errors that occur in ship deployment.

Additional objects, features and advantages of the present invention will become more readily apparent from the following detailed description of preferred embodiments when taken in conjunction with the drawings wherein like reference numerals refer to corresponding parts in the several views.

DETAILED DESCRIPTION OF THE PREFERRED EMBODIMENTS

Figure 1:
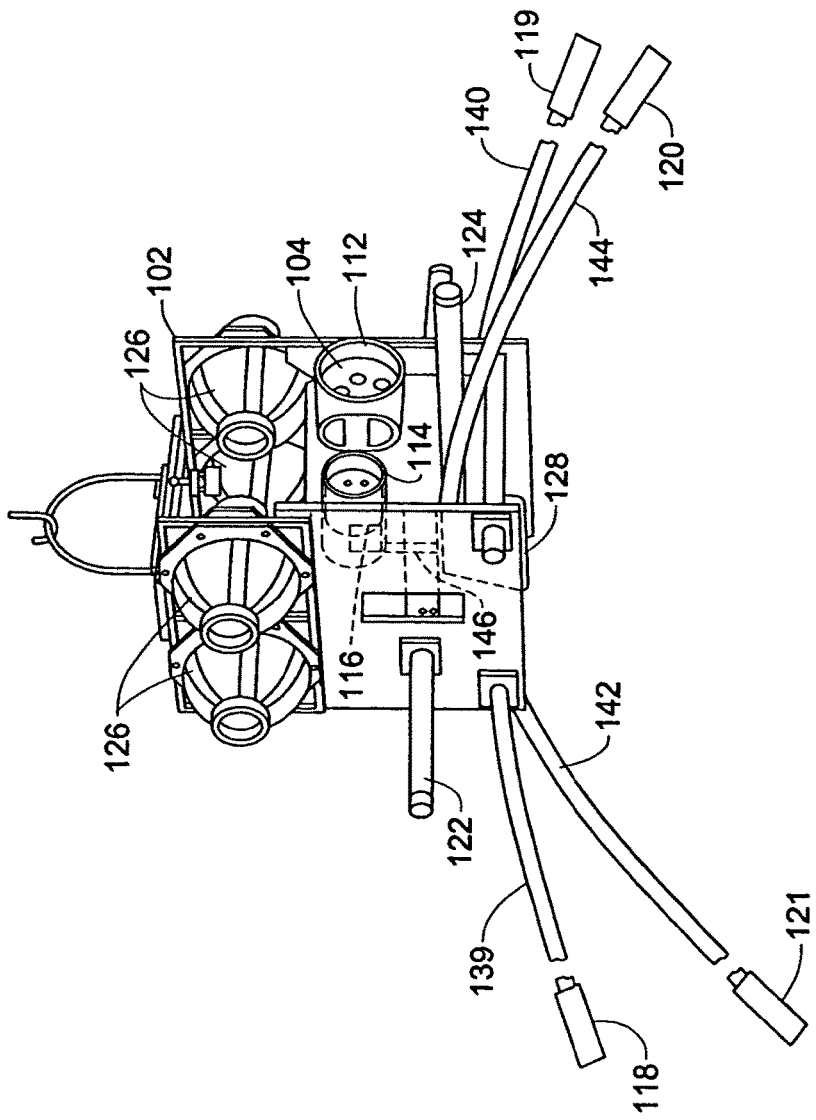
FIG. 1 is a perspective view of an underwater electromagnetic measurement system built according the prior art.
Figure 2:
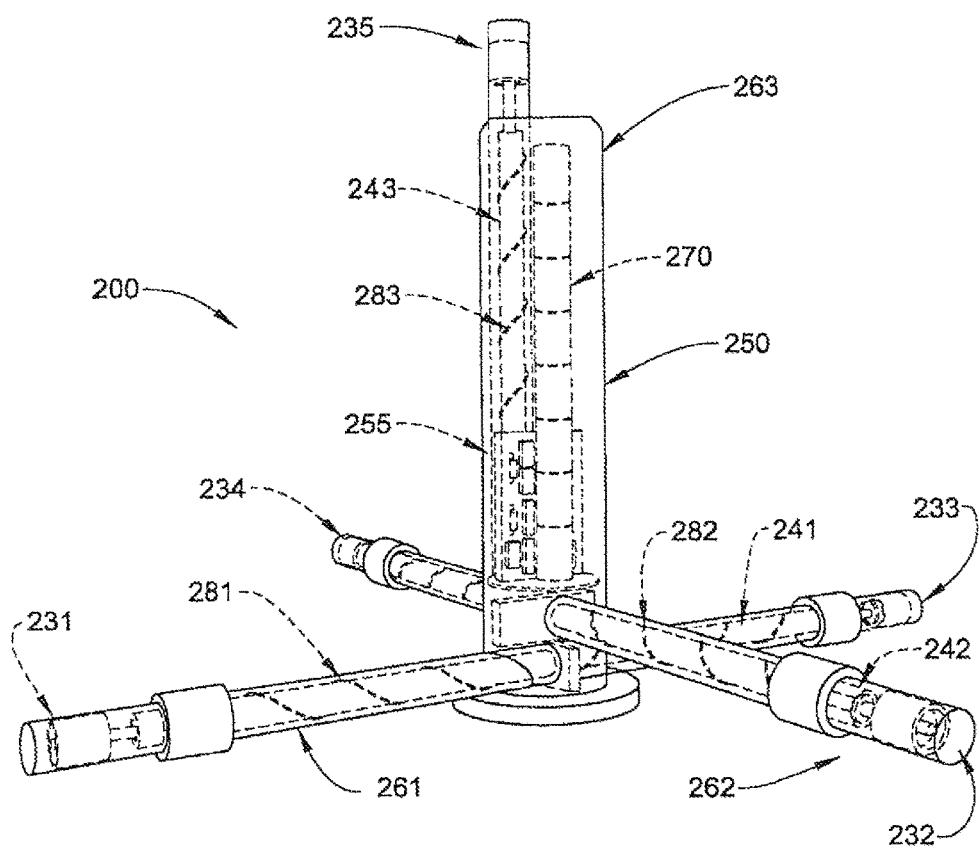
FIG. 2 is a perspective view of a compact electromagnetic sensor system built according to the invention.

With initial reference to FIG. 2, a sensor package 200 for measuring electric and magnetic fields comprises a compact arrangement of electric potential antennas 231-235 and magnetic induction coils 241-243 integrated in a single pressure vessel 250. A data acquisition system 255 to record and save sensor data and a power supply 270 are also housed within pressure vessel 250. Pressure vessel 250 is comprised of discrete connected compartments 261, 262, 263 to minimize size and weight. All electrical connections to and between the antennas 231-235, coils 241-243 and data acquisition system 255 are enclosed within pressure vessel 250. All electrical components remain connected at all times. In particular, antennas 231-235, coils 241-243 and other electrical systems are never disconnected from data acquisition system 255 of system 200 during normal operation.

The single integrated form of pressure vessel 250 enables the magnetic field induction coils 241, 242 to be configured in a compact cross configuration that minimizes the distortion one coil 241 produces on the field measured by the other coil 242. A benefit of the configuration built according to the invention is that connecting pressure compartment 263 for the data acquisition system 255 directly to the pressure compartments for the field induction coils enables the first stage amplifiers for the magnetic field sensors to be co-located with the data acquisition system 255, thereby minimizing the size of the pressure vessel compartments 261, 262 needed to enclose the magnetic field induction coils 241, 242. Indeed, the entire magnetic field signal amplifier needed for each magnetic field induction coil can be integrated with the circuits of the data acquisition system thereby further minimizing the size of the pressure vessel 250 and reducing the number of internal electrical connectors and cables.

Around each magnetic field induction coil 241-243 is a source coil 281-283 that can produce a local magnetic field that is sensed by its respective magnetic field induction coil. In FIG. 2, the source coils are shown as extended helixes 281-283 wound along the length of the magnetic field induction coil. However, the source coils can be any length compatible with the pressure vessel and even a single turn coil can be used. The generated magnetic field can be activated when needed. In particular, it can be turned on for a brief time after the system is deployed in order to confirm the operation of the magnetic field sensors and further calibrate in a limited way their response function in the exact location where the data are to be collected. Similarly, small conductors (shown as 523 in FIG. 9) are integrated into each electric field potential antenna, in order to generate a local electric potential, when desired. Use of single integrated pressure vessel 250 greatly facilitates connecting and operating the sources of magnetic and electric fields used to confirm sensor operation to the data acquisition system 255.

Figure 3:
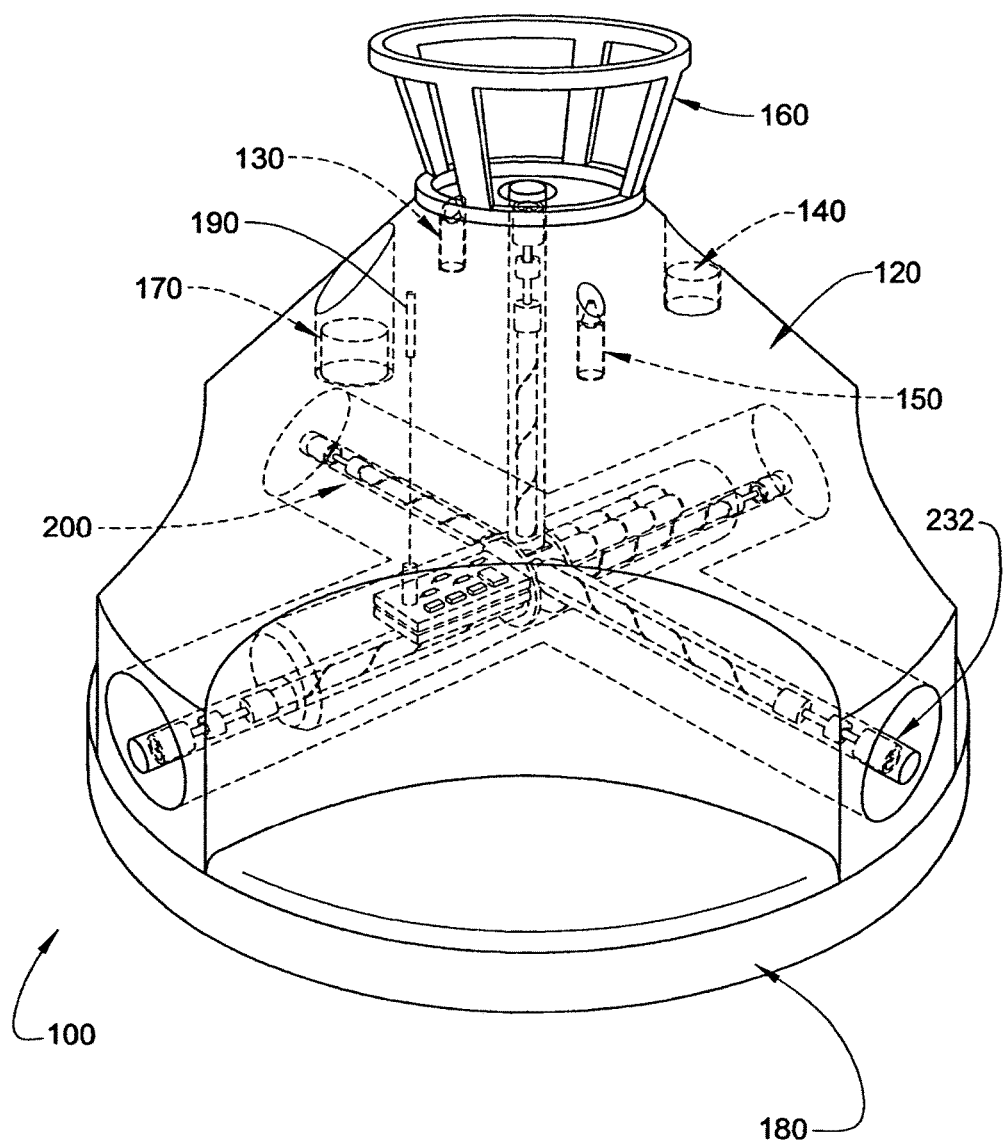
FIG. 3 is a perspective view of a system for underwater electromagnetic measurements according to another preferred embodiment of the invention.

The sensor package is incorporated with other system elements as shown in FIG. 3. The overall form of the underwater EM measurement system 100 is a sensing package 200, connected to flotation device 120 which can also serve as the structure which connects all the system elements, and navigation 130, beacon 140, flasher 150, retrieval ring 160, acoustic transponder 170, anchor 180, and an antenna 190. In FIG. 3, antenna 190 is shown crossing the wall of pressure vessel 150. However, it is possible for antenna 190 to be within vessel 150 provided that an RF transparent window of sufficient size is built into vessel 150. Because of the close proximity of the electric potential antennas 232 etc. to the frame and ancillary systems, it is essential that all system components in contact with the medium be highly nonreactive in order to minimize the occurrence of electrochemical corrosion potentials. Owing to the revolutionary design of the sensing package, the size of the anchor and flotation elements can be significantly reduced. As a result, the overall EM measurement system 100 has approximately 1/10 the maximum linear dimension, and 1/4 the volume of prior state-of-the-art systems. These size reductions allow many more measurement systems to be carried on a given ship, and make handling on board ship much easier.

In the preferred operational mode the system is deployed underwater on the seafloor. However, in this application the terms ocean, seawater and seafloor are used to refer generally to a body of water within which a sufficient level of electrical conduction can occur, and are not intended to be limited to the ocean, but rather include lakes, rivers and ground that is saturated, or has been made sufficiently saturated, for an adequate connection to the electric potential antennas. In particular, by underwater it is meant that the electric potential antennas are in contact with sufficient fluid to provide an adequate capacitive coupling. By seafloor, it is meant that the surface of the land of which the subsurface geological properties are to be probed and the fluid region to which the electric potential antennas couple. Similarly, the provision of ancillary systems for flotation and anchoring apply to the most common current practice of deep ocean deployment and are not meant to be limiting. Indeed, systems could be emplaced and/or retrieved by submarines, lowered to the seafloor via cables, or deployed by hand in marshes. Further, the principal application is the collection of data for imaging of seafloor conductivity profiles via the magnetotelluric (MT) or controlled source electromagnetic (CSEM) methods. However, the measurement system is neither limited to these applications nor to the 0.001 Hz to 10 Hz frequency ranges usually cited for these applications.

Figure 4:
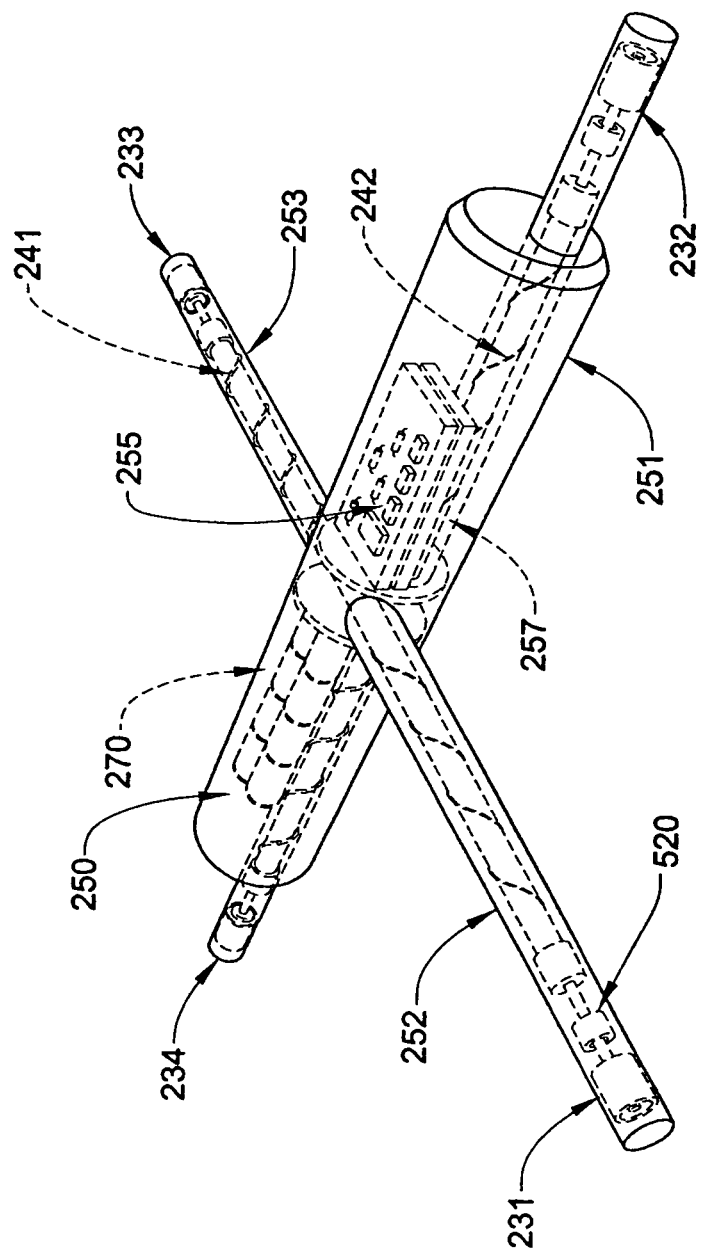
FIG. 4 is a perspective view of a sensing package for underwater electromagnetic measurements.

Another second exemplary form of the sensor package 200 is shown in FIG. 4. Two magnetic field induction coils 241, 242 and their associated signal amplifiers four electric potential antennas 231-234, and their associated signal amplifiers (not labeled), a data logging processor 255, and a power supply 270 are integrated into a single pressure vessel 250 that allows the sensors and electronics to be maintained at approximately atmospheric pressure during deep ocean deployment. The magnetic field signal amplifiers and the clocking device are integrated into the data logging processor 255, or into a circuit board 257 that is adjacent to the data logging processor. Similarly, the electric field signal amplifiers are integrated into the data logging processor 255, or into the circuit board 257, although the first stages of the electric field signal amplifier may be located adjacent to the electric potential antenna as indicated by element 520 (see discussion below). The pressure vessel is comprised of a central hub 251 connected to a set of ancillary pressure cases 252, 253 in the form of tubes arranged in a defined configuration. The combination of tubes 252, 253 and hub 251 provides an optimum trade-off between the specific sensor orientations needed, the volume of the pressure protected space, and the fabrication and material costs. The ancillary pressure cases 252, 253 are sealed to the hub 251 either by welds, glue joints or sealing gaskets, such as o-rings. If desired, at least the pressure cases 252, 253 can be a single tube that intersects hub 251 with appropriate cutouts for cable access. In a preferred embodiment, the tubes housing the magnetic field induction coils are welded to the pressure case, and the ends of the tubes are closed with end caps that seal to the tubes by gaskets. The electric potential antennas are integrated into the end caps of the induction coil tubes in the manner described below. Since the electric potential antennas must contact the seawater in order to operate, a sensing package built according to this preferred embodiment has the feature that it requires the minimum possible number of sensor electrical connections through the pressure vessel.

In prior art systems, discrete pressure cases are used for the system elements of the sensing package. In particular, this involves the cables that connect the magnetic field induction coils to their magnetic field signal amplifiers and the electric potential antennas to their first stage amplifiers passing through the seawater. The signals produced by the magnetic field induction coils and electric potential antennas can be as small as 1 nV ($10^{-9}$ V). Exposing the cables directly to the flow of seawater can result in the generation of spurious electrical signals and can cause general degradation of cable performance. Thus, a benefit of enclosing all sensor cables within pressure vessel 250 is that it prevents them from coming into contact with the medium, thereby reducing the possibility of the associated noise and cable failure. A further benefit of an integrated sensing package is that any electrical connectors in the cables between the antennas or coils are within the pressure vessel and thereby prevented from the possibility of exposure to seawater. A defect of prior art systems is that they have one or more electrical connectors in each antenna and coil signal path that must operate in high pressure seawater. Such connectors can be become damaged when connected or disconnected and, if seawater penetrates the connector, it can lead to electrochemical corrosion noise. The impact of such failures is exacerbated in prior systems because these problems do not manifest themselves until the system is deployed on the seafloor, and are not detectable until the collected data are analyzed.

In the preferred form of the system, two magnetic field induction coils are positioned in an approximately horizontal plane. This orientation is provided by the measurement system sitting on the seabed, or if the system is located within a body of water, by a suitable combination of flotation devices and anchors. In the simplest version, the magnetic field induction coils intersect at right angles. However, it is only necessary that the sensors are configured such that, operated together, they measure components of the ambient magnetic field in orthogonal directions. As with the magnetic coils, the electric field sensors must be configured for orthogonal measurement of the ambient electric field, but the electric field measurement axes can be independent of the magnetic field axes if so desired. However, in the preferred embodiment, the electric field antennas are mounted on the end of the pressure vessels housing the induction coils, thereby aligning the electric field and magnetic field measurement directions.

Figure 5:
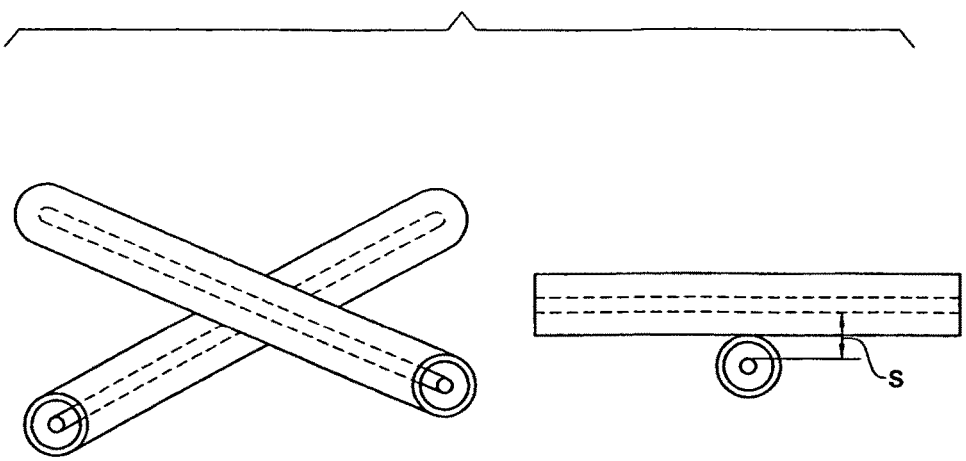
FIG. 5 is a diagram showing the definition of orthogonal offset between magnetic field induction coils in separate pressure vessels.
Figure 6:
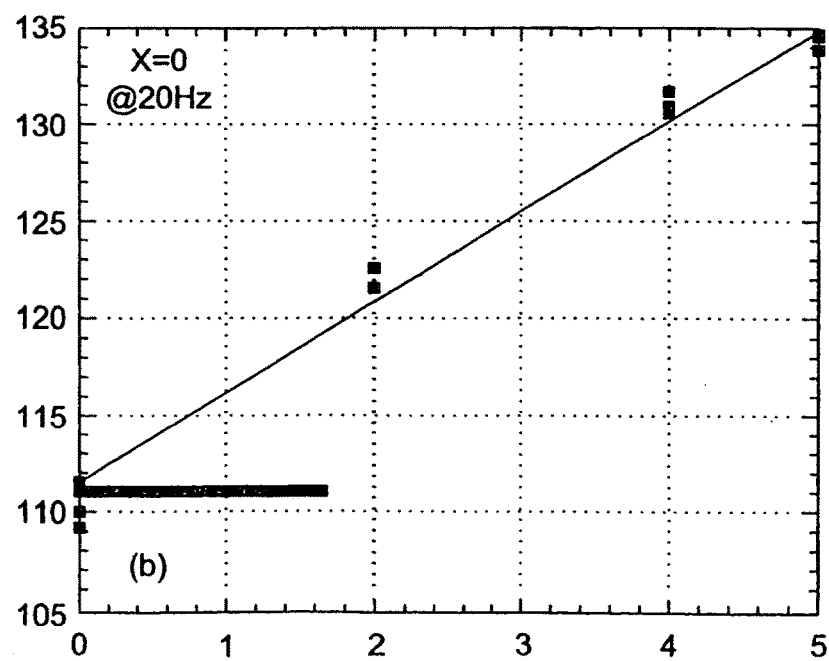
FIG. 6 is a graph showing the measured field distortion effect of one magnetic field induction coil on another.

A particular benefit of placing the magnetic field induction coils in the same pressure vessel is that the orthogonal distance, s, between them can be much less than if they were in separate pressure vessels as shown in FIG. 5. The distance, s, is orthogonal to the plane of the two coils. In the case of coils in separate vessels, the minimum distance between the coils is set by the thickness of the pressure vessel wall and the internal clearance left for the coil. For a high strength material such as aluminum 6061 alloy in deep water (5000 m), a wall thickness of approximately 0.5 cm is required. Allowing 0.5 cm for clearance and a further 1 cm for assembly tolerance in the supporting structure, the magnetic field induction coils in present deep ocean measurement systems are at least 3 cm apart (s=3 cm). FIG. 6 shows the measured magnetic field distortion of one magnetic field induction coil on another vs. the orthogonal separation (i.e. distance s) between their centers. In this measurement, two magnetic field induction coils are arranged orthogonally so that they cross at their centers (as in FIG. 5), and the ambient magnetic field is aligned along the axis of one coil. The coil response for an isolated coil (s=∞) is shown as the solid bar (response=111) in FIG. 6. Counter to intuition, the effect of one magnetic field induction coil on another when the coils are touching (s=0) is minimal, with the interaction getting linearly stronger as the cores are moved apart up to a separation of at least 5 cm. The high permeability cores used in the magnetic field induction coil increase the coil sensitivity by drawing in the surrounding magnetic field parallel to their axis over a distance on the order of the coil length. The reason for this surprisingly minimal effect of one core on another when they are touching is that the cores essentially produce a null in the field immediately outside themselves. As a result, when the cores are very close to each other, they are actually located in a low field region and so their net distorting effect is minimized. As a result, integrating both coils into a common pressure volume so that their separation is minimized (s→0) provides a more accurate measurement of the ambient magnetic field than prior art systems in which the magnetic field induction coils were separated by at least the thickness of the pressure vessel wall, and often a considerably larger distance.

The fundamental signal to be measured by the electrodes is the electric field. In practice the electric potential is measured at two spatially separate points and the potential difference, $V_a - V_b$, recorded. The potential difference is related to the electric field in the medium by Equation 1:

$$V_a - V_b = E_{ab} r \qquad [1]$$

where $E_{ab}$ is the electric field being measured and r is the linear separation between the measurement points. For a given $E_{ab}$, the measured potential difference can be increased by making the spacing, r, between the electrodes larger. In other words, increasing r enables higher voltage noise at the electrode to be offset, and this is the reason present systems have a 10 m span between electrodes (i.e. r=10 m). The vector direction of r defines the direction of the electric field, E. Accordingly, it is possible to measure E in two directions using only three electrodes, in a configuration in which one electrode is common to each electric field signal.

Figure 7:
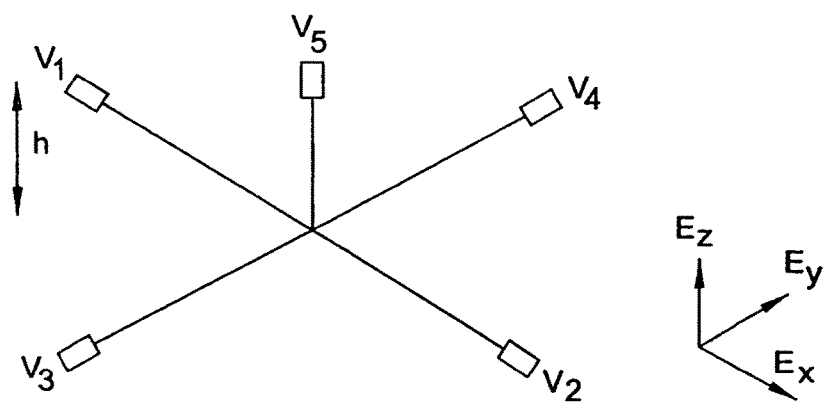
FIG. 7 is a schematic of a three-axis sensor configuration defining the antenna voltages in the vertical and horizontal axes.

In the exemplary form of the sensing package shown in FIG. 2, a fifth electric potential antenna and a third magnetic field induction coil are integrated into the sensing package so that they measure a component of the electric field and a component of the magnetic field in a direction orthogonal to the plane of the other two pairs of electric and magnetic field sensors. The electric field along the direction from the center of the four electric potential antennas to the fifth antenna can be determined by subtracting the average of the four electric potential readings ($V_1$, $V_2$, $V_3$, $V_4$), in the horizontal plane from the reading ($V_5$) of the fifth antenna. In a standard deployment in which the four electric potential antennas are in a substantially horizontal plane, the direction of the fifth potential antenna with respect to the base is substantially vertical, and the electric field in this direction, $E_z$, is given by Equation 2:

$$E_z = \frac{V_5}{h} - \frac{(V_1 + V_2 + V_3 + V_4)}{4h} \qquad [2]$$

where h is the height of the fifth antenna from the plane containing the four horizontal antennas, as shown in FIG. 7. Benefits of deriving the vertical electric field by the formula given in Equation 2 include that only one additional potential antenna is required instead of the two additional antennas needed in a standard potential difference measurement (see Equation 1), and using the horizontal antennas provides the maximum value of h for the smallest net increase in system height. Certainly, the vertical field could also be measured via a self-contained additional measurement channel by adding two additional electric field potential antennas and a separate electric filed signal amplifier so that they measure a component of the electric field orthogonal to the plane sensors for the horizontal field. Adding a measurement of the electric and magnetic fields in the orthogonal direction makes it possible to resolve the final field data into any desired set of three-axis coordinates, which is a benefit in some underwater imaging applications.

Figure 8:
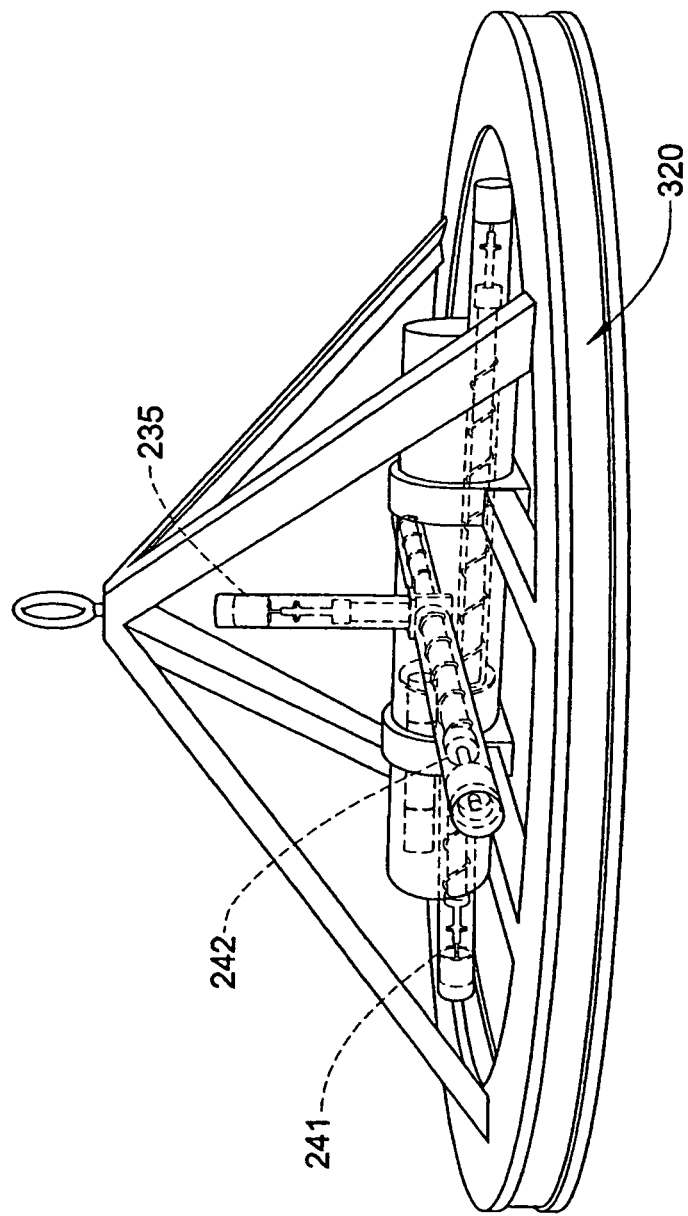
FIG. 8 is a perspective view of yet another preferred embodiment of the invention including a three-axis sensor configuration with the vertical magnetic field sensor placed around the horizontal magnetic field sensors.

It is generally not necessary to measure the vertical electric field, $E_z$, and vertical magnetic field, $B_z$, with the same sensitivity as for the horizontal fields. Accordingly, the effective separation, h, of the electric potential antennas in the vertical direction, and the length of the vertical magnetic field induction coil can be less than the equivalent values in the horizontal plane. Reducing the system height has the benefit of reducing the lateral drag force on the system due to water flow. This is particularly important because such force can cause the sensors to move in the Earth's DC magnetic field resulting in spurious magnetic field signals. In addition, prior systems have been lost due to movement caused by water currents. To further reduce the lateral forces from the water, the vertical magnetic field induction coil can be configured as a flat coil 320 essentially encircling the horizontal magnetic field sensors as shown in FIG. 8. Variants of the three-axis configuration can be constructed with a vertical electric field sensing capability 235, or without a vertical magnetic field capability to reduce costs in some applications.

Figure 9:
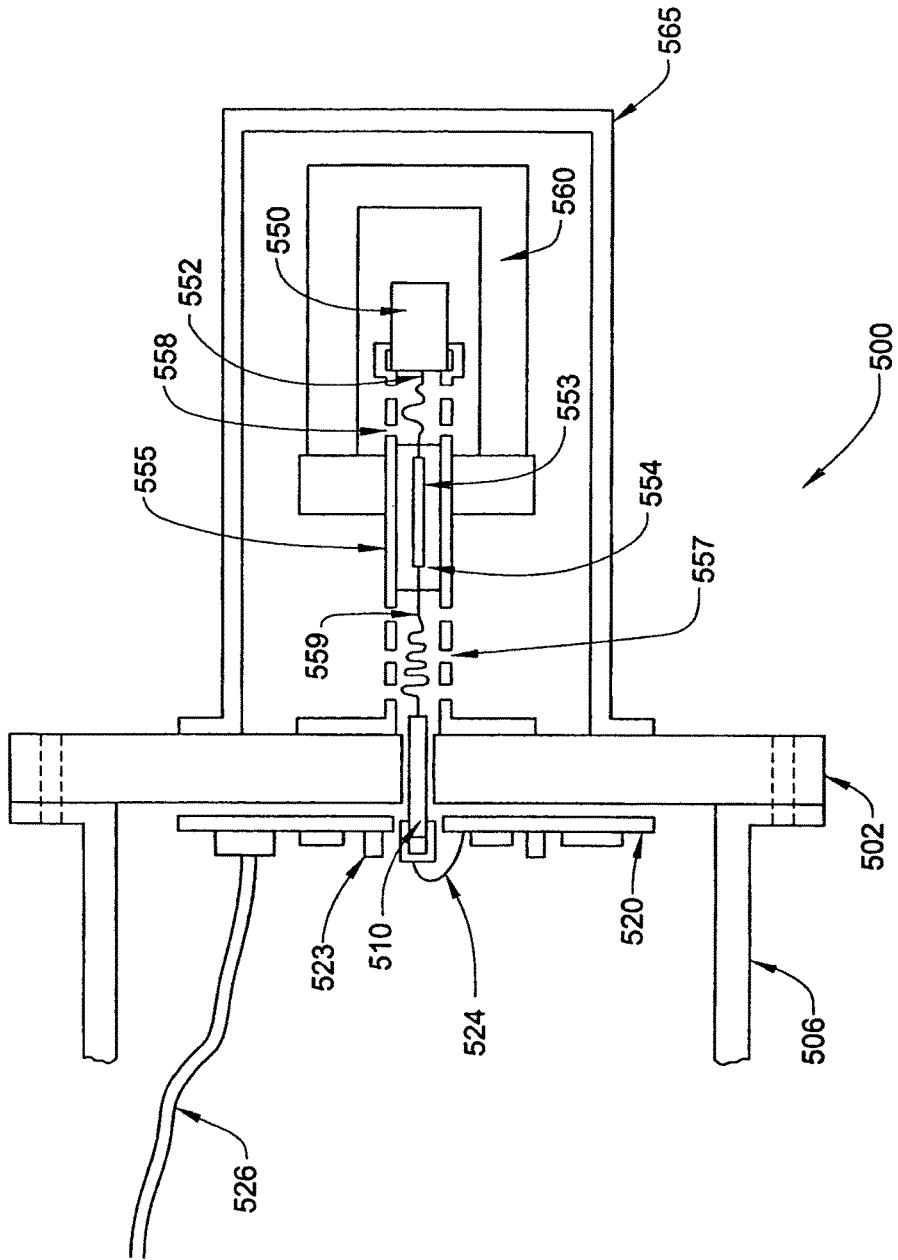
FIG. 9 is a diagram of the electric potential sensing assembly.
Figure 10A:
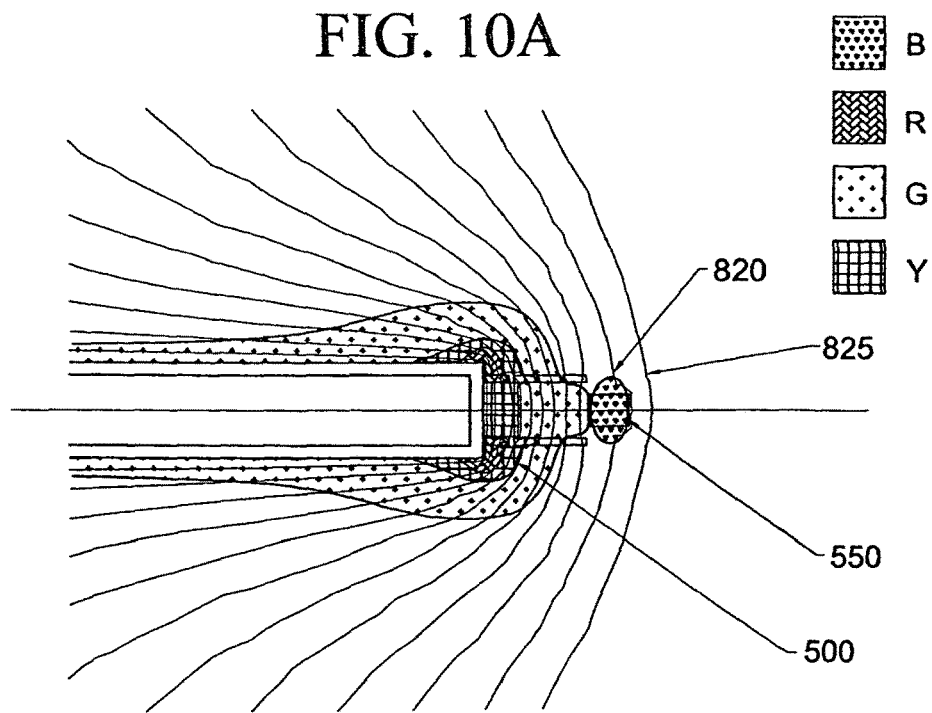
FIGS. 10a and 10b show how the distortion in the ambient electric potential caused by the electric potential antenna can be reduced by allowing the medium to flow into the internal spaces of the antenna.
Figure 10B:
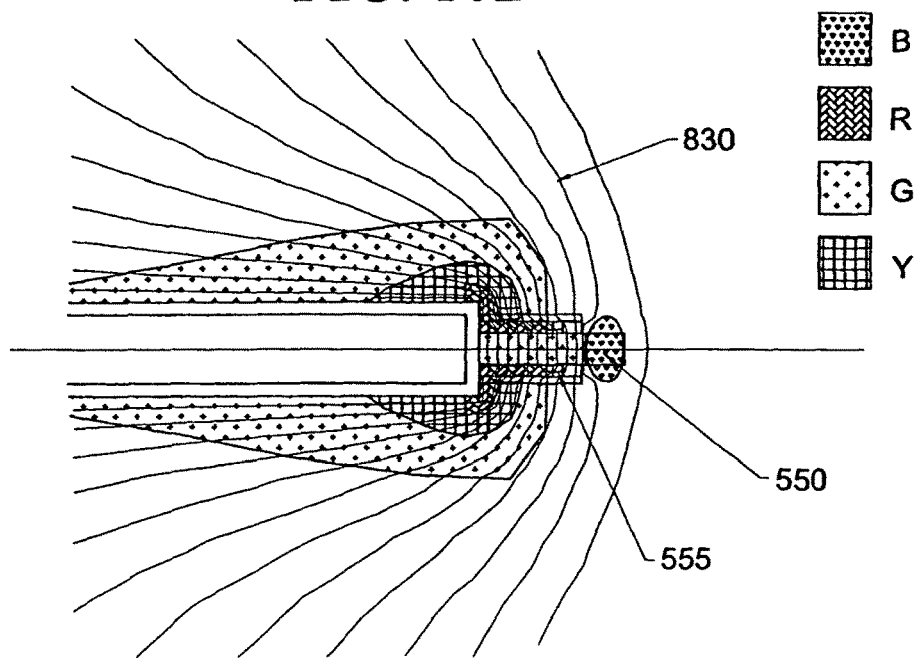

In the preferred embodiment, the electric potential antennas are integrated into the end caps of the pressure vessels that house the magnetic field induction coils. The configuration of the electric potential antenna assembly 500 is shown in FIG. 9. Electric potential antenna 550 is mounted to the pressure vessel end cap 502 by a perforated connecting tube 555. The combination of end cap 502 and pressure vessel 506 produces a conducting void in the seawater which has the effect of distorting the electric field that is to be measured. The length of tube 555 is approximately equal to the radius of end cap 502 in order to position electrode 550 away from the region of high electric field distortion present at end cap 502. The perforated region 557 of tube 555 allows seawater to flow into the tube thereby minimizing the volume of seawater excluded by tube 555 in order to minimize the distortion of the ambient electric field in the vicinity of end cap 502. FIG. 10 shows the calculated electric potentials in the vicinity of assembly 500 with and without the perforated region 557. For the perforated case, FIG. 10*a*, the line of constant electric potential 820 that passes through electrode 550 is parallel to line 825 in the open medium confirming that there is minimal distortion of the local electric potential. For the unperforated case, FIG. 10*b*, the constant potential line 830, (equivalent to line 820 in FIG. 10*a*), bends into tube 555 and does not pass through the electrode 550, showing that the local electric potential is significantly distorted.

With reference back to FIG. 9, electrode 550 is connected to electric potential signal amplifier 520 by a series of conducting wires and pins. In FIG. 9, amplifier 520 is shown connected to the inside surface of end cap 502, but it can be located anywhere within the pressure vessel. Wire 552 preferably has substantially the same chemical composition as electrode 550 in order to minimize the relatively rapid electrochemical reactions that occur between dissimilar materials exposed to an electrolyte such as seawater. Preferably, the junction is exposed to seawater by perforations 558 in tube 555 in order to maximize the area of electrode 550 in contact with the seawater. If wire 552 has a different composition than electrode 550, it is preferable to seal their junction to minimize the exposure to seawater. Preferably, wire 552 connects to a rod 553 which is optimized in conductivity and area to provide the minimum series resistance between electrode 550 and amplifier 520. If necessary, rod 553 is connected to a second narrow wire 559 in order to minimize the volume of seawater excluded in the perforated region 557 of tube 555. Whether wire 559 is used depends on the acceptable level of distortion in the electric field to be measured. The electrical connections to rod 553 are enclosed in sealing material 554 constructed according to methods known to those skilled in the art in order to prevent their exposure to seawater. Wire 559 is connected to end plate feedthrough 510. This feedthrough has a high pressure seal to end cap 502 and is constructed according to methods known to those skilled in the art.

The motion of seawater around electrode 550 is minimized by the use of porous cap 560. This cap allows water to enter the space around the electrode 550 on the time scale on the order of minutes at typical pressures found at modest seawater depths (>10 m), but inhibits turbulent flow of fluid around the antenna. The entire antenna assembly is protected from mechanical forces by cover 565 which is constructed from a mesh or grill-type material in order to minimize the distortion it produces in the electric field to be measured.

In a preferred embodiment, the electric potential signal amplifier 520, or at least the first stage of the amplifier, is integrated directly onto the inside of the end cap 502. Locating the amplifier here minimizes the length of conductor 524 needed to carry the signal from feedthrough 510 to the input port of amplifier 520. As for the magnetic field induction coils, the signal produced by the electric potential antennas is very low, on the order of 1 nV. Minimizing the length of conductor 524 minimizes the pickup of spurious voltages produced by electromagnetic fields inside the pressure case. In particular, the data processing components and power system will inevitably produce some level of electric field interference, and locating amplifier 520 at the end cap enables the signal of interest to be amplified above the level of this interference before being transmitted via cable 526 into the main body of the pressure vessel. In contrast, in prior art systems the signal from the electric potential antennas passes through cables 5 m in length before it is first amplified.

The subtractions of the amplified electric potential voltages to provide the voltage differences involved in determining the substantially horizontal fields (Equation 1 above) and the substantially vertical field (Equation 2 above) are preferably performed using analog differencing circuits and are then further amplified. For convenience, we refer to the amplification components located at the end cap, the differencing circuit and the following amplifier as an electric field signal amplifier. Each such electric field signal amplifier for the fields in the horizontal plane (Ex, Ey—see FIG. 7) is therefore connected to two electric potential antennas, while the electric field signal amplifier for the vertical field, Ez, is connected to all five electric potential antennas. Alternatively, the signal from the individual electric potential signal amplifiers is digitized and the difference between the voltages is calculated by the data logging processor. In this case, we refer to the two electric potential signal amplifiers at the end cap (and any post amplification used) as the electric field signal amplifier for a horizontal axis, and the group of all five electric field potential amplifiers as the electric field signal amplifier for the vertical axis.

The signal from each magnetic field induction coil is amplified by a magnetic field signal amplifier. As for the electric potential signal amplifiers, in the preferred embodiment, the magnetic field signal amplifiers are located as close to the source of their input signals (in this case the magnetic field induction coils) as possible in order to minimize the pickup of spurious signals from inside the pressure vessel before the signal is amplified. In an innovative design, the output cables from the induction coils used for the horizontal axes exit from the center of the coil, rather than the end, as is customary in the prior art. This arrangement enables the magnetic field signal amplifiers to be located at the center of each coil and within the hub, and minimizes both the length of cable carrying the unamplified signal from the coil, and the length and diameter of the part of the pressure vessel that only houses a horizontal coil.

The outputs of the magnetic field and electric field signal amplifiers are filtered, digitized and stored by the data acquisition system. In general, the data acquisition system is designed and constructed according to methods known to those familiar in the art. As discussed, an innovative element of the invention is to enclose the acquisition system within the same pressure vessel as the electromagnetic sensors. Thus, an important feature of the design of the acquisition system is to minimize the emitted electric and magnetic field interference and noise it produces. For example, an electric current, I, of 1 mA in a long wire produces a magnetic field, B, of 200 pT at a distance, r, of 1 m from the wire, by the relationship $B = \mu_o I / 2\pi r$, where $\mu_o$ is the permeability of free space. A magnetic field of 200 pT is approximately 1000 times larger than the fields of interest in underwater magnetic measurements. Approaches to minimize such interference are to separate the low noise circuit elements as far as possible from the digitizing and storage electronics, and to lay out all current paths so that an equal and opposite current flows in an adjacent conductor. In particular, it is important to design the system to minimize the use of switching voltage regulators, and ensure digital operations do not occur within the measurement frequency band of interest.

In a further element of electronic integration, the control electronics for the acoustic communications link and transponder are integrated into the same pressure vessel as the acquisition system and power supply. Such integration removes the need for a separate battery unit to power the acoustic system electronics, and ideally the electronics are integrated into the same circuit board 255 or suite of circuit boards 257 as the other system electronics. Integrating the electronics in this manner facilitates the data acquisition system interfacing with the acoustic transponder for the purpose of sending operational status messages to the surface. Such messages enable the system operators to confirm that the measurement unit is fully operational before data are recorded.

A time reference is provided to the data acquisition system by a highly accurate clock. In the current practice, an array of multiple electromagnetic measurement systems is deployed on the seafloor for a period of up to 30 days. It is important that the data be recorded with a time reference that is accurate between the multiple systems in order that data can be processed across the entire array. In practice, a maximum clock drift of 5 msec (0.005 second) per day is commonly specified for hydrocarbon applications of seafloor mapping. Clocks of this accuracy can be purchased from a number of commercial sources but have the deficiency of requiring relatively high power in order to maintain their main oscillator at a constant temperature. One way to minimize the required clock accuracy is to send a timing pulse from the surface via the acoustic link. A benefit of integrating the transponder into the same pressure vessel as the data acquisition system is that the output of the acoustic link can be acquired directly into the data acquisition system without uncontrollable time delays due to the interaction of independent modules. By using an external timing reference, the required accuracy of the clock can be reduced, for example, from 5 msec per day to order 100 msec per day if a reference is used once per day. An additional reduction in the power used by the clock, and indeed the entire system, can be achieved by operating the system in a standby mode until a control signal is sent via the acoustic link to operate the entire system at full power, and to reset the clock time.

Data output is provided via a high speed digital link. Using such a link removes the need to open the pressure case to remove data storage media, and removes the risk of the media not being reinstalled correctly. The data link can be provided by a wired connector, via a wireless link operating through an RF-transparent window in the pressure vessel, or via a small antenna external to the pressure vessel. In the case wired connections are used, the connections can be protected from the high ocean pressure using a pressure cap that is removed at ambient air pressure when access to the download port is desired.

The power for the sensor package is provided by rechargeable batteries. Recharging eliminates the need of prior art systems to unseal a pressure case in order to remove and replace the batteries, and eliminates the cost of the new batteries themselves. In a preferred embodiment, pressure-tolerant batteries are exposed directly to the ocean pressure in order to minimize the volume of the sensor package pressure vessel 250. Placing the battery pack outside the sensor package pressure vessel 250 requires that an electrical connection be made through the wall of the pressure vessel 250 in order to transfer electric power from the batteries outside to the electronics inside pressure vessel 250. However, having the batteries outside removes the need for an electrical connection through the pressure vessel wall to carry the power for recharging, so there is no net increase in the number of electrical connections through pressure vessel 250. Having the battery pack outside does require that a cable be outside pressure vessel 250 in order to carry the power from the batteries to the pressure vessel. However, the effect of electrical interference and noise picked up by this cable is only passed to the power rails of the internal electrical system and its end result is negligible compared to the same level of interference and noise picked up by cables connected to the electric or magnetic field signal amplifiers.

As described, the integration of the magnetic field induction coils and the electric potential sensing antennas via the same pressure vessel as the data logging processor results in a much simpler overall system and eliminates the presence of cables carrying the very small signals of interest outside the pressure vessel. On a practical level, the use of a single pressure vessel 250 with no exposed sensor cables allows a continuous protective layer to be produced over the entire sensor package by use of a dip coating. Such a coating provides a preferred way to cover joints in the pressure vessel and thereby to minimize the occurrence of corrosion voltages and corrosion currents. In addition, fully integrating the electric potential antennas into the end caps of the pressure vessel allows the practical addition of other innovative system elements, which would otherwise be unfeasible if they had to be coupled and controlled by cables, associated connectors and systems outside the pressure vessel. The primary additional feature beyond those available in current prior art underwater EM measurement systems is the capability to generate electric potentials and magnetic fields in the vicinity of the respective antennas in order to confirm that the system is able to detect such fields within the desired limits. Around each magnetic field induction coil is a small source coil of 1-10 turns that, when needed, can produce a magnetic field that is sensed by the B-field sensor. In particular, this generated field can be activated for a brief time after the system is deployed on the seafloor in order to confirm the operation of the B-field sensors before the measurements of interest are made. In addition, by generating a field over a desired range of frequencies, the response function of the measurement channel can be calibrated in a limited way in the exact location where the data are to be collected. Similarly, with reference to FIG. 9, a small source potential is coupled into conductor 524 either capacitively or resistively in order to generate a local electric potential at the input to amplifier 520. Preferably, the source is a conductor 523 on the amplifier circuit board that couples capacitively to the amplifier input, for example to conductor 524, but a direct resistive connection could be made by a suitable bulk resistor if desired. Alternatively, the source signal can be produced by a conductor embedded in the insulated body of the perforated connecting tube 555 such that it does not come into contact with seawater. In this configuration, the primary coupling between the source conductor and the electrode 550 is via their mutual capacitance. As for the magnetic field channels, the generated electric potential can be activated to confirm suitable operation, and the response function of the measurement channel can be calibrated by generating potentials over a desired range of frequencies.

Both the electric potential and magnetic field sources can be activated when the system is in air on the dock of the deck of a ship, and when the system is submerged. In the case of the electric field sensors, it is necessary to calibrate the response to the source for wet and dry conditions separately. In the general concept of operation, the sensing package pressure vessel is never opened except for factory maintenance or repair. When the systems are shipped to their required destination, the end-to-end operation of each measurement channel is confirmed by activating each source potential or field in turn. Similarly, correct operation can be confirmed on the ship prior to deploying the system into the ocean, and once the systems are on the seabed. The data logging processor can be programmed to repeat the seabed functional check and/or in situ calibration as often as desired. In all cases, the absolute value of the signals recorded by each measurement channel is not critical, but rather it is critical to confirm that the values recorded for a given source strength have not changed since the system was first operated in the factory before shipment. The process to confirm sensor channel operation and report the result can be programmed to occur automatically following the command to report the system operational status.

In a preferred embodiment the assembly 120 used for the flotation device also serves as the support structure which connects all system elements together. Combining these system elements reduces the system cost and weight and also reduces the number of dissimilar materials in contact with each other. In a further preferred embodiment, the flotation device protects the sensor package against impacts and abrasion, which may damage the insulation coating over the pressure vessel.

A benefit of the compact system with its reduced size is that it facilitates the integration of an orientation module in close proximity with the magnetic field induction coils. In the prior art, a separate orientation module is used to measure the orientation of the sensor axes with respect to the Earth's magnetic field. The navigation module generally uses a magnetic compass to determine heading relative to magnetic north, and the DC field of the Earth that this compass measures is distorted by the presence of the permeable cores in the magnetic field induction coils. In the prior art, this is overcome by locating the orientation module on the overall system support structure at a nearest distance on the order of 50 cm from the magnetic field induction coils. This remote location requires that the orientation module be located within a separate pressure vessel and have its own recording system and dedicated power system. In a compact system built according to the invention, the orientation module can be integrated into the same pressure vessel as the magnetic field induction sensors, and incorporated into the same physical circuit boards (e.g. 257). This is possible because the reduced size of the overall electromagnetic measurement system allows it to be rotated in the Earth's field by methods known to those skilled in the art, in order to calibrate out the distorting effect of the induction sensors on the data produced by the navigation module compass. When the navigation module is so integrated into the common pressure vessel, its output can be recorded by the data acquisition system and its power can be provided by the common system power supply.

A further benefit of the compact system size is that it facilitates deployment and retrieval of the system. In the prior art, systems required retrieval from the ocean via a crane or similar structure that protrudes over the side of the survey ship in order to prevent damage to the electric field sensors on the end of their booms. Use of such a crane requires attaching a hook to the sensor system, which is difficult from the deck of a ship, and can be hazardous. The small size of the sensor system allows it to be deployed into the ocean from a chute. In addition, after it has returned to the surface, it can be collected from the ocean by a simple net or scoop.

Figure 11:
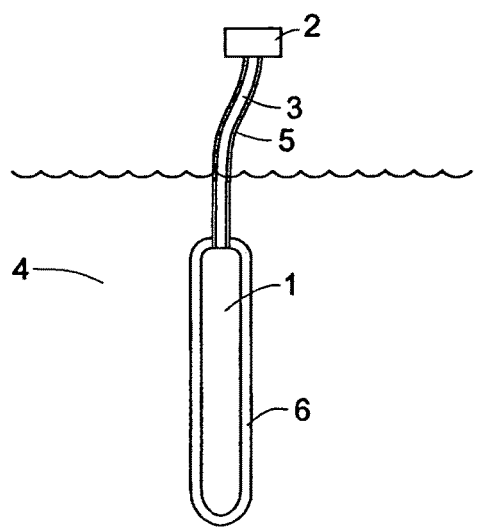
FIG. 11 shows an insulated electrode connected to a potential measuring device built according to the invention.

The electrodes are made of a conducting material that is intentionally electrically insulated to prevent the transfer of a resistive current to the medium. FIG. 11 shows the paradigm configuration of an electrode constituted by a conductive material 1 which is electrically connected to an amplifier 2 by means of a wire or other connecting element 3. Some, or all, of the electrode is immersed into a medium 4, the electrical potential of which is to be measured. The wire 3 is thoroughly insulated from the medium 4 by means of an insulating material 5 or other means. Electrical conduction and electrochemical reactions between conductive material 1 and medium 4, are minimized by a layer of insulating material 6.

In order to provide a capacitive electrode as defined, the geometry and materials selected for the body of the electrode 1 and insulating barrier 6 should have the following characteristics:

1. Insulating material 6 should not react chemically with the medium 4 or with conductive material 1 in order to minimize electrochemical noise and provide long useful lifetime.
2. Insulating material 6 should be a good electrical insulator in order to minimize current flow from electrode conductor 1 to the medium that might occur due to undesired electrochemical reactions between material 6 and medium 4.
3. Insulating material 6 should form over conductor 1 in a continuous manner without defects in order to prevent conductor 1 coming into contact with medium 4.
4. The electrode should have high surface area in order to provide a high capacitance, $C_e$. The capacitance is proportional to the electrode surface area.
5. Insulating material 6 should be thin in order to provide a high capacitance. The capacitance, $C_e$ is inversely proportional to the thickness of material 6.
6. Insulating material 6 should have a high dielectric constant in order to provide a high capacitance, $C_e$. The capacitance is proportional to the dielectric constant.

Certain of the goals 1-6 above will conflict with each other in a practical system and in practice a trade-off is made depending on the frequency of the signal of interest, the acceptable electrode size, and the specific chemical properties of the medium. For instance, a thinner insulating material 6 will increase capacitance, but will also increase the likelihood of pinholes or other defects that could allow conductor 1 to come into contact with, and thereby react with, medium 4. Similarly, increasing the electrode area will increase the probability that a defect of a critical size is present in insulator 6. In contrast to prior uses of capacitive electrodes, in a system built according to the invention, achieving extremely low system noise is critical while traditional capacitive metrics such as breakdown voltage and stored charge are irrelevant.

Materials which are generally unreactive at zero or low voltage bias relative to the medium can have an electrochemical reaction if a voltage is imposed. In addition, materials which do not themselves react can act as a catalyst for other chemical reactions if a driving voltage is present. Thus, in an exemplary embodiment, the amplifier that is connected to the electrodes is specifically designed in order to minimize the presence of voltages imposed between the electrodes and the medium. Specific design modifications are the use of circuits to prevent the amplifier drawing a DC current from the electrodes (thereby producing a DC voltage difference between the electrodes and the medium), and electrically isolating the amplifier from the outside world to enable it to float electrically with respect to the medium.

Figure 12:
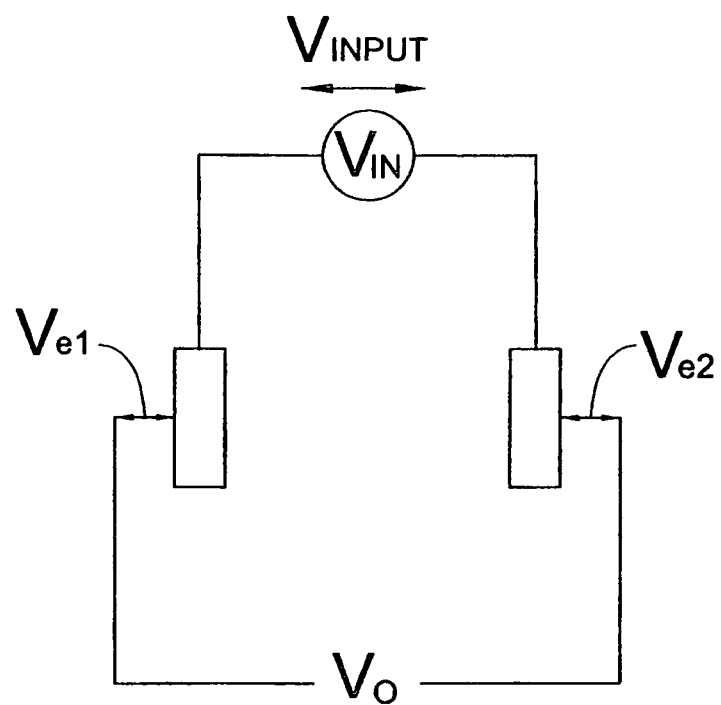
FIG. 12 is a perspective view of two electrodes of arbitrary form coupling to a potential difference $V_0$ in a medium.

As discussed, the innovation using an insulated conductor for the electrode in the electric potential antenna is a critical element in achieving a reduced overall system size, and in enabling a much more convenient method of operation compared to the prior art. The paradigm measurement configuration for two electrodes of arbitrary form coupling to potentials in a medium is shown in FIG. 12. The potential difference at the two measurement points in the medium, $V_o$, is spread between the interface between the first electrode surface and the medium within which it resides ($\Delta V=V_{e1}$), the input to the readout apparatus ($\Delta V=V_{input}$) and the second electrode surface and the medium within which it resides ($\Delta V=V_{e3}$), such that $V_o=V_{e1}+V_{e2}+V_{input}$. In the common practice, the electrical impedance between the electrode and the ambient medium, $Z_{em}$, is made as small as possible. Reducing the impedance minimizes the voltage drops $V_{e1}$ and $V_{e2}$ at the electrode-to-medium interface, resulting in the potential difference of interest $V_o$ appearing maximally across the input of the readout apparatus, i.e. $V_{input} \sim V_o$. This arrangement maximizes the amplitude of the signal at the input to the readout apparatus. For a resistive electrode, according to the prior art, $Z_{em}$ is predominantly a resistance. In this case, an additional significant reason for making $Z_{em}$ as small as possible is to minimize noise in the measurement. For example, if the electrical resistance between the electrode and the medium is 100 Ohms, a Nyquist noise of 1.3 nV will be produced.

The way to make resistance small in prior art systems designed to have the maximum sensitivity (i.e. minimum internal noise) is to use an electrode that exchanges ions with the electrolyte via an electrochemical reaction. For example, the standard way to do this for seawater is via an Ag electrode with a surface of AgCl. However, Ag/AgCl electrodes have a number of practical problems: A) there is a DC potential difference associated with the reaction that varies between electrodes. As a result, electrodes have to be carefully paired to minimize the net DC offset; B) the DC offset depends on temperature, salinity and exposure to light, and as a result drifts with time when the electrodes are deployed until slowly reaching an equilibrium. This drift appears as low frequency noise in the measurement; C) the chemical equilibrium at the electrode surface is easily disturbed by turbulence. As a result, porous barrier materials are often placed around the electrodes to minimize fluid flow. These barrier materials can become clogged by microorganisms.

The way to remove all of these noise sources is to take active measures to prevent as far as possible any electrochemical reaction at the electrode surface. This is done by coating the conducting electrode in a passivating layer that is impervious to the medium, and does not itself chemically react with the medium. In the limiting case, there is infinite electrical resistance between the electrodes and the medium. In this case, the coupling between the electrode and the medium is entirely capacitive.

Capacitive electrodes, and systems that make measurements via capacitive means (e.g. water level sensors) have been variously developed for a number of practical reasons (e.g. skin comfort), not connected with the ultimate levels of measurement sensitivity needed to exceed the capabilities of state-of-the-art resistively coupled electrodes. Indeed, prior to the development effort that led to the discovery described herein, no scheme had been proposed whereby a non-resistively coupled electrode could improve upon the low noise performance of existing resistive electrode technology.

Figure 13:
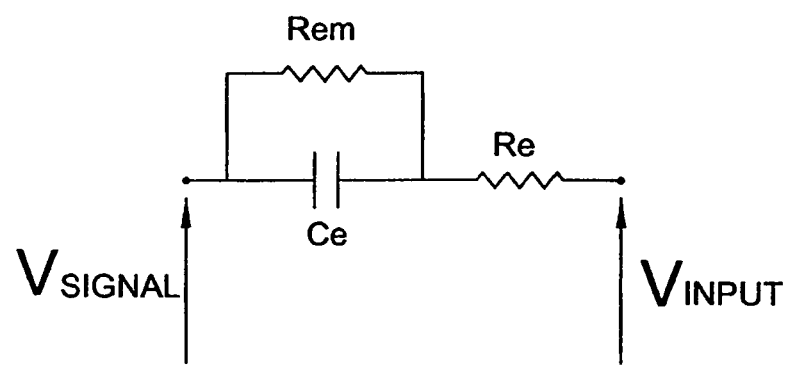
FIG. 13 is a schematic showing a first-order equivalent circuit for a general electrode in a conducting medium.

The first order equivalent circuit for a general electrode (i.e. not specifically capacitive or resistive) is shown in FIG. 13. For clarity, this circuit ignores effects associated with the medium, such as the Warburg impedance that is associated with the diffusion of ions in solution. In both the resistive and capacitive cases, the signal coupled into the readout is given by Equation 3, where the electrode impedances, $Z_{e1}$, $Z_{e2}$, are the sum of the resistive, $R_{em}$, and capacitive, $C_e$, components appearing in parallel, i.e. $Z=R_{em}/(j\omega C_e R_{em}+1)$, in which $\omega$ is the angular frequency ($=2\pi$ times the frequency of the signal) and $j=\sqrt{-1}$, and the resistance of the body of the electrode, $R_e$, is considered negligible.

$$V_{input} = \frac{Z_{input}}{Z_{e1} + Z_{e2} + Z_{input}} V_{signal} \quad [3]$$

As discussed, low noise electrodes as used in the prior art are predominantly resistive. As a result, the electrode impedance $Z_e$ is given by the resistance between the electrode and the medium, $R_{em}$, and Equation 1 becomes a conventional resistor divider network as given by Equation 2. As noted above, for a given input resistance of the readout, the voltage presented to the readout, $V_{input}$, is maximized as the electrode-to-medium resistances, $R_{em1}$, $R_{em2}$ become smaller.

$$V_{input} = \frac{R_{input}}{R_{em1} + R_{em2} + R_{input}} V_{signal} \quad [4]$$

In the case of an electrode coated in a passivating layer to prevent resistive coupling, $R_{em} \to \infty$, $Z_e=1/j\omega C_e$, and Equation 1 becomes:

$$V_{input} = \frac{j\omega C_{e1} C_{e2} R_{input}}{(C_{e1} + C_{e2})(j\omega C_{input} R_{input} + 1) + j\omega C_{e1} C_{e2} R_{input}} V_{signal} \quad [5]$$

where $C_{input}$ is the input capacitance of the readout apparatus. It is desirable that the input resistance to the readout stage be made sufficiently large at the signal frequency that $\omega C_{input} R_{input} \gg 1$, usually by making $R_{input}$ very large by suitable design of the readout apparatus. In this preferred case, Equation 5 becomes frequency independent with the form of a capacitor divider.

$$V_{input} = \frac{C_{e1} C_{e2}}{(C_{e1} + C_{e2}) C_{input} + C_{e1} C_{e2}} V_{signal} \quad [6]$$

In practice, it is straightforward to arrange that $C_{e1}$, $C_{e2} \gg C_{input}$ and so, as for the optimum case of resistive electrodes, $V_{input} \sim V_{signal}$. Thus, according to Equation 6, it is possible to couple potentials from the medium into the readout apparatus with high efficiency without requiring an electrical coupling resistance between the sensing electrodes and the medium.

Figure 14:
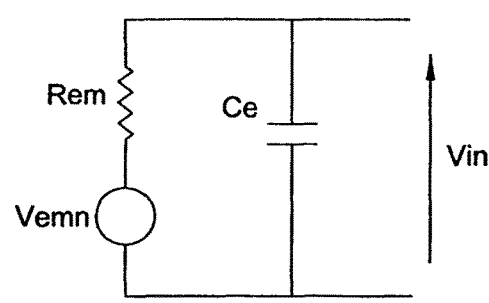
FIG. 14 is a schematic showing an equivalent circuit for noise in a general electrode in a conducting medium.

However, although Equation 6 shows that coupling a signal into a two-electrode, capacitively coupled measurement system is possible, it does not prove that such a measurement can be lower noise than using a resistively coupled electrode, either in theory or in practice. In the latter case, it is, in practice, impossible to construct a perfectly insulating passivating barrier, and there will always be some finite $R_{em}$. FIG. 14 shows the equivalent circuit model to determine the voltage noise produced by an electrode, including a non-infinite $R_{em}$ at the input to the readout apparatus. A voltage source, $V_{emn}$, in series with $R_{em}$, has been explicitly added to represent the voltage noise produced by $R_{em}$. The noise, $V_{in}$, at the input to the readout apparatus is given by Equation 7.

$$V_{in} = \frac{V_{emn}}{1 + j\omega C_e R_{em}} \quad [7]$$

Equation 7 shows that given that a finite $R_{em}$ is always present, the noise $V_{emn}$ it produces can be reduced if $\omega C_e R_{em} \geq 1$. In the regime where $\omega C_e R_{em} \gg 1$, Equation 7 can be simplified to the form of Equation 8, where $V_{emn}$ has been replaced by $\sqrt{(4kTR_{em})}$.

$$V_{in} = \frac{1}{j\omega C_e} \sqrt{\frac{4kT}{R_{em}}} \quad [8]$$

Equation 8 shows that in the regime $\omega C_e R_{em} \gg 1$, the equivalent noise coupled into the readout apparatus that is caused by the resistance between the electrode and the medium, $R_{em}$, is reduced as $R_{em}$ is increased. This is in contrast with conventional case of the resistive electrodes in which $V_{in}$ is increased as $R_{em}$ is increased. In real applications, such as electrodes deployed in seawater, $V_{emn}$ is dominated by electrochemical corrosion noise rather than Nyquist noise, but to first order the corrosion noise is also proportional to $\sqrt{R_{em}}$. Thus, in practice, the noise of a resistive electrode is higher than predicted by Equation 6, but it follows the Equation 6 dependence on $1/\sqrt{R_{em}}$ in which the noise is reduced as $R_{em}$ is increased.

There are therefore two possible domains of very low noise operation for electrodes in a conducting medium:
1. The conventional, prior art domain in which the electrode is resistively coupled. In the resistive domain, the noise produced by the electrode coupling to the medium decreases as $R_{em}$ is reduced ($V_{emn} \geq \sqrt{(4kTR_{em})}$).
2. In the regime $\omega C_e R_{em} \gg 1$. In this domain, the noise produced by the electrode coupling to the medium decreases as $R_{em}$ is increased (Equation 8).

It is therefore potentially of significant technical and commercial interest to develop an electrode that couples to a conducting medium such that $\omega C_e R_{em} \gg 1$. As a starting point, note that a state-of-the-art 15 cm long×1 cm diameter Ag/AgCl electrode used for underwater electric potential measurements has $C_e$=7 mF and $R_{em}$=10Ω resulting in an $\omega C_e R_{em}$ product at 1 Hz of 0.44. This, perhaps surprisingly, high value is due to the high capacitance of a bare metal exposed to a conducting fluid. If the electrode were passivated by a 1 μm thick insulating layer of dielectric constant 3, its capacitance would be approximately 130 nF. For an electrode of capacitance 130 nF, $R_{em}$ would have to be on the order of 1 100 MΩ ($10^8$Ω). While this may seem a reasonable value compared to available bulk electronic components, achieving $R_{em}$=100 MΩ over a film on the order of 1 μm is thick requires a bulk resistivity of $5 \times 10^{11}$ Ωm. Producing an insulating, water-impermeable film over a significant three-dimensional surface area with an accuracy of 1 μm in thickness is a significant technical challenge.

Table 1 below lists a series of candidate electrode materials and configurations that were constructed and then measured in seawater by the inventors with the aim of meeting the criterion $\omega C_e R_{em} \gg 1$ in a practical, cost-effective way that could be deployed underwater. For reference, a reagent grade (i.e. high purity) Ag/AgCl disc electrode sold commercially as a reference electrode for laboratory measurements is shown in the first row of Table 1. The electrode materials were selected with the following rationale:

Platinum: Pt is used as a standard electrode in a number of electrochemical processes because it does not react with water. It therefore should have high $R_{em}$. The coupling capacitance, $C_e$, should also be high because of the high specific capacitance of a bare metal surface in an electrolyte.

Silicon/silicon nitride: $Si_3N_4$ is a very hard material that can be grown in a very thin layer with very few surface defects on a commercial silicon wafer.

Carbon fiber: As for Pt and Ti, carbon has very little reactivity to water. In addition, a bundle of carbon fibers should have a very high surface area which is beneficial because it provides a low absolute impedance at the amplifier input.

Titanium: Ti metal is very unreactive in water and should have a high value of $C_e R_{em}$ for the same reasons as platinum.

Titanium-ruthenium alloy: Ti—Rh alloy is used as a catalyst in several commercial electrochemical processes because it is unreactive.

Tantalum: Tantalum metal (Ta) has a stable, highly insulating oxide layer ($Ta_2O_5$) which can be grown to a precise thickness by applying a voltage to electrodes in one of a variety of ionic solutions. In the experiments reported in Table 1, tantalum oxide was grown on a sheet of tantalum metal. Sintered tantalum powder is very porous and has a very high surface area which offers the possibility of low absolute impedance at the amplifier input. For tantalum powder, the passivation barrier is formed by natural oxidation of the tantalum surface in the presence of air forming a thin "native oxide".

TABLE 1

Characterization of Candidate Electrode Materials in Seawater

| Material | Size | $C_e$ (μF) | $R_{em}$ (kΩ) | $\omega C_e R_{em}$ (1 Hz) |
|---|---|---|---|---|
| Ag/AgCl disc | 1 cm diameter | 7000 | 0.01 | 0.44 |
| Platinum |  | 780 | 0.024 | 0.12 |
| Silicon/Silicon Nitride | 80 cm$^2$ | 0.01 | 3,600 | 0.23 |
| Carbon fiber bundle | 12,000 fibers | 1000 | 0.1 | 0.6 |
| Titanium with native oxide | ~5 cm$^2$ | 25 | 5,000 | 0.79 |
| Ti—Ru alloy | ~20 cm$^2$ | 250 | 30 | 47 |
| Tantalum, 20 nm thick oxide | ~5 cm$^2$ | 5 | 1,500 | 47 |
| Tantalum, 20 nm thick oxide | ~250 cm$^2$ | 250 | 40 | 63 |
| Sintered tantalum powder | 1 cm cube | 50,000 | 1-10 | 300-3000 |

The results summarized in Table 1 show that nominally inert materials (e.g. Pt, carbon fiber) have a surprisingly low resistance in seawater. This is almost certainly due to unintended chemical reactions either catalyzed by, or with, the electrode surface. In addition, the very small cross section of carbon fibers results in a bulk electrode resistance $R_e$ (see FIG. 13) on the order of 10s of Ohms. For a metal electrode, $R_e$ is of the order of $10^{-3}$-$10^{-6}$ Ohms and its effects have been considered negligible in the analysis above. The resistance $R_e$ appears in series with $C_e$ and $R_{em}$ and contributes to the noise of the system in the form of thermal noise ($\sqrt{4kTR_e}$). For 20Ω over a bandwidth of 10

Hz, this noise is >1.5 nV and greater than the target noise specification in many underwater applications. Materials such as $Si_3N_4$ and Ti have high $R_{em}$ but insufficient $C_e$. In terms of capacitance per unit area, Ti and Ti—Rh provide the highest values (5 $\mu F/cm^2$ and 12.5/$cm^2$ respectively) with tantalum with a 20 nm oxide barrier having $C_e$=1/$cm^2$. However, Ta/$Ta_2O_5$ has much less electrochemical activity in seawater, with Rem~10 M$\Omega cm^2$ compared to 25 k $\Omega cm^2$ and 600 k$\Omega cm^2$ for Ti and Ti—Rh respectively. It should be noted that for a given material, $C_e$ and $R_{em}$ scale in proportion and in inverse proportion respectively with surface area, and so it is not possible to change the product $C_e R_{em}$ by simply changing its size.

For operation over the 0.1 Hz to 10 Hz range used for controlled source electromagnetic sounding, Table 1 shows that Ti—Rh alloy and any of the tantalum-based electrodes provide an adequate $\omega C_e R_{em}$ product. At the lower frequency range of 0.001 Hz to 0.1 Hz used for magnetotelluric sounding, only sintered tantalum powder clearly has adequate properties. However, as frequency is reduced, the environmental electromagnetic noise below 1 Hz increases approximately as 1/frequency, which means that the requirement for extraordinarily low electrode internal noise is relaxed. Accordingly, Ti—Rh alloy and any of the tantalum-based electrodes are likely to have application in seafloor MT also.

It is likely that the values of $R_{em}$ will be different in other conducting media e.g. fresh water, or water with high pollution content (i.e. potentially reactive chemical species). Further, additional alloyed combinations of metals and coatings on conductors are likely to have equivalent or better properties when other factors such as fabrication cost, aging mechanisms, and resistance to algae growth are included. Accordingly, the choice of materials used in the passivated electrodes for use in measuring very small electric potentials in a conducting medium is not meant to be limited by those listed in Table 1, but rather by the requirement $\omega CeRem \gg 1$ over the primary frequency range of interest.

Figure 15:
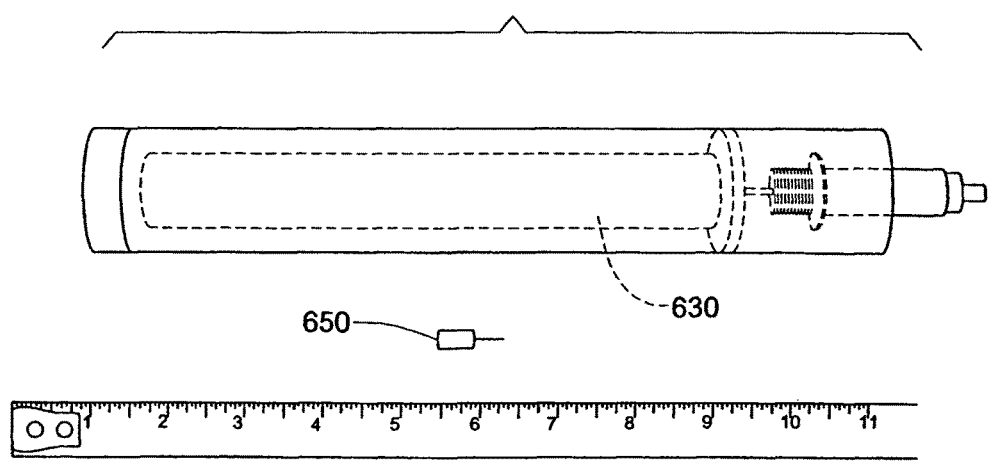
FIG. 15 is a perspective view of an Ag/AgCl electrode built according to the prior art (top) compared to a sintered Tantalum powder electrode built according to the invention.
Figure 16:
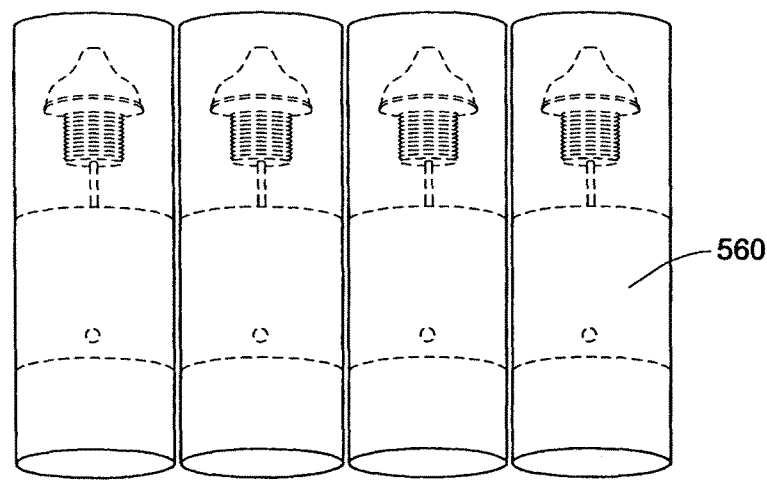
FIG. 16 is a perspective view of four complete electric potential antennas built according to the invention and used for measuring electric fields in deep ocean water.
Figure 17:
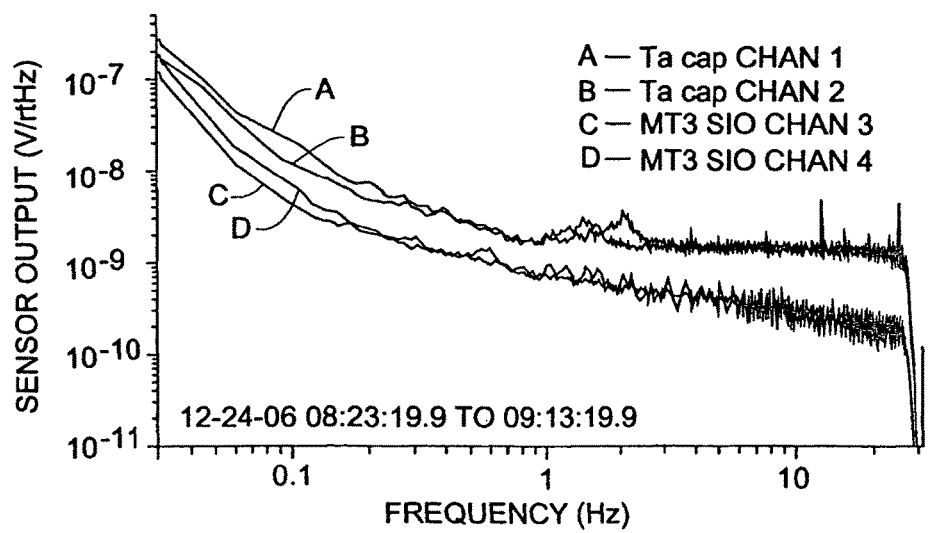
FIG. 17 is a graph showing a comparison of electric field sensor system performance measured underwater.

For the sintered tantalum powder electrode in seawater, $C_e$=50 mF and $R_{em}$>1 k$\Omega$ can be achieved, resulting in $\omega C_e R_{em}$ at 1 Hz of at least 300 and a corresponding reduction in the electrical noise produced by $R_{em}$ of at least 300 (Equation 8). The noise given by Equation 8 is 20 pV compared to 290 pV calculated for the Ag/AgCl electrode, illustrating the benefit of the capacitive regime. It should be noted that these values are much lower than found in practice because $\sqrt{(4kTR_{em})}$ is an absolute lower limit for the voltage noise $V_{emn}$ when an electrode makes a resistive contact via an electrochemical reaction. It should be also be noted that capacitive, $TaO_2$ coated electrodes have a low impedance, on the order of 3$\Omega$, at 1 Hz. A sintered tantalum powder electrode 650 is compared to an Ag/AgCl electrode 630 built according to the prior art in FIG. 15. FIG. 16 shows four complete electric potential antennas built according to the invention and used for measuring electric fields in deep ocean water. The cylinder 560 around each electrode is a porous cover denoted 560 in FIG. 9. A comparison of electric field spectra as measured by sintered tantalum capacitive underwater antennas built according to the invention and a conventional Ag/AgCl-based system built according to the prior state-of-the art co-deployed off the coast of San Diego, USA in 1 km of water is shown in FIG. 17. At 3 Hz, the new capacitive electrode system is 5 times more sensitive than the best prior technology.

Materials which are generally unreactive at zero or low voltage bias relative to the medium can have an electrochemical reaction if a voltage is imposed, for example across the electrodes. An example of this is Au, which reacts with seawater to form $AuCl_2$ at a bias voltage of 0.3 V. In addition, materials which do not themselves react can act as a catalyst for other chemical reactions. For example, a Pt electrode catalyzes a variety of electrochemical reactions with ions commonly found in water, such as $OH^-$, $Cl^-$ and $SO4^-$ at a range of voltages from +1 V to −1 V. Some combination of reactions of this kind is responsible for the low value of $R_{em}$ recorded for Pt in seawater (Table 1).

Figure 18:
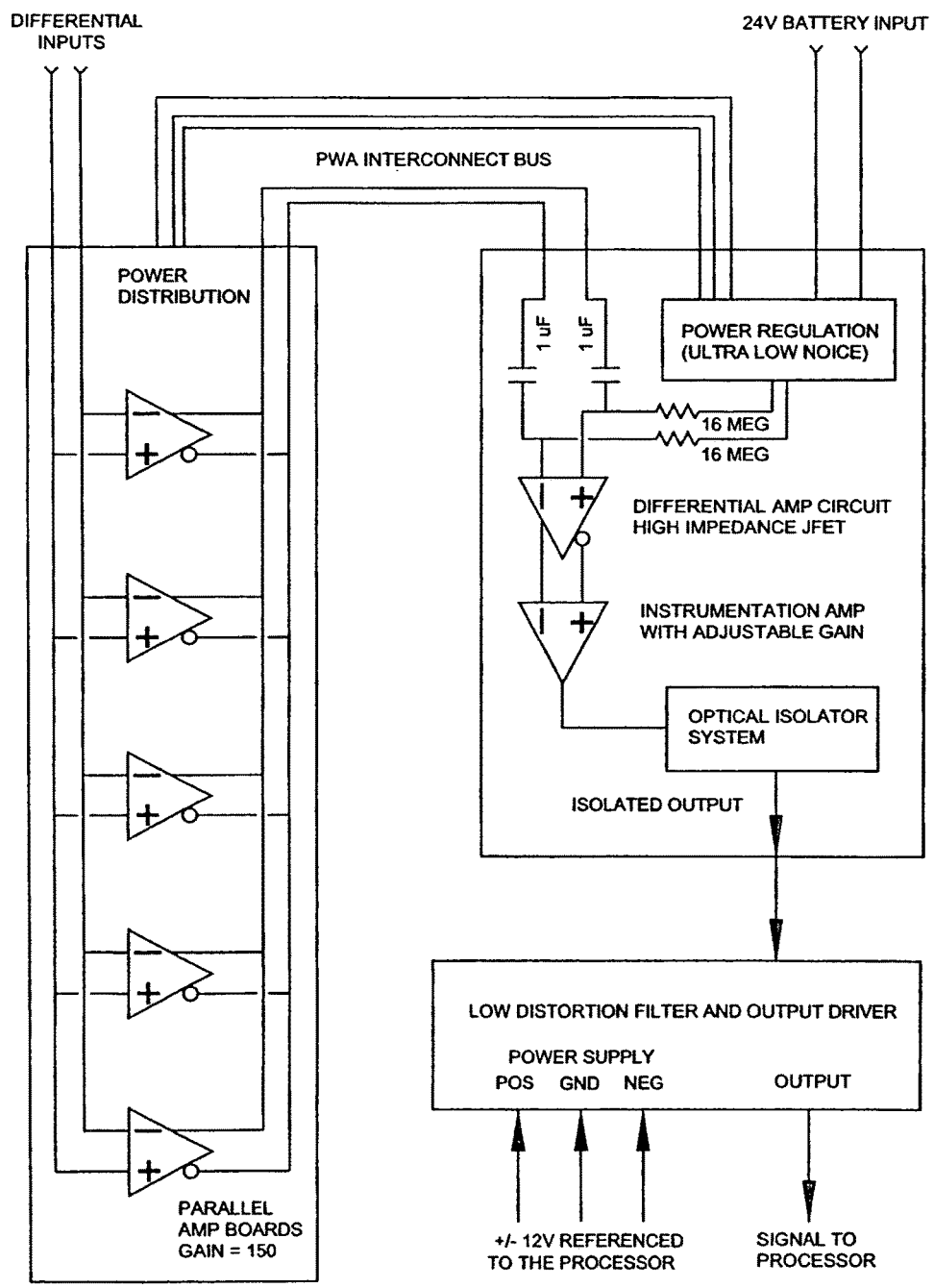
FIG. 18 is a diagram of the electric field signal amplifier.

In a practical environment, it is very difficult to be sure that a potentially reactive ionic species is not present at a threshold concentration in the medium. Accordingly, implementing a potential measurement in which the electrodes have negligible, or at least small, voltage noise compared to other elements in the system requires that the electric field readout apparatus operate without producing a quasi-DC common mode voltage bias, $V_{bias}$, between the electrodes and the medium, the effect of which is to produce an average driving voltage of $\pm V_{bias}/2$ for electrochemical reactions at each electrode surface. An amplifier designed for measuring very low electric potentials in this way is shown in FIG. 18. The amplifier consists of an analog amplification module connected to an electrically isolated battery power supply and circuit ground point. The output of the analog amplification chain is connected to an analog optical isolation stage which serves as the interface to a digitizing module, which itself is referenced to the DC potential of the other system elements, for example the magnetic field amplifiers. Alternatively, the analog amplification module and digitizing module are connected to a common, electrically isolated, battery power supply and circuit ground point, and the output of the digitizing module is connected to a digital optical isolation stage, which serves as the interface to the DC electrical potential of the recording system and other system elements. By one of these means the difference between the average DC potential of the input to the amplifier module and the medium can be minimized.

The preamplifier is comprised of a low noise differential-in to differential-out preamplifier front end followed by differential and instrumentation amplifier stages. The first stage amplifiers are designed with very high common mode rejection ratio at their inputs in order to decouple any residual average driving voltage (i.e. $V_{bias}/2$) from the analog ground voltage of the amplifiers and digitization modules. In addition, it is beneficial to place capacitors between the output of the preamplifier and the input of the second stage amplifier in order to block the coupling of DC potential between the remainder of the system and the preamplifier output.

In addition, it is important to ensure that the input biasing circuit for the readout apparatus does not require a significant DC current flow from the medium to the electrodes, because providing such a current requires a resistive coupling to the medium with its associated electrochemical noise. Thus, the preamplifier must operate as if its input is an open circuit. Basic methods to achieve this for sensors that measure the electric potential in free space (in practice, air) have been taught by Krupka in U.S. Pat. Nos. 6,686,800 and 7,088,175, incorporated herein by reference.

A further requirement for a system that uses a high impedance electrode is to minimize the effect of the current noise, In, of the readout apparatus. The current noise present at the input of the preamplifier acts on the impedance of the electrodes to produce a noise voltage at the input. For a system with two measurement electrodes, this current noise produces a voltage noise on the order of In ($Z_{e1}+Z_{e2}$). In the prior art, resistive electrodes often have low impedance and so current noise is relatively unimportant. In a capacitive system in which $R_{em}$ is deliberately large, it is important to make the electrode capacitance large enough that the current noise of the input stage does not dominate its overall noise performance.

In the circuit shown in FIG. 18, the preamplifier operates with a differential input. This means that if the preamplifier is mounted on the end cap 502 (see FIG. 9), then one input can be connected as shown by the short conductor 524. However, in the form shown in FIG. 18, the second input must come from a second electric potential antenna assembly, which, given the need to separate the electric potential antennas, is located a distance on the order of 1 m away. As discussed, having the conductor 524 long and threaded within the pressure vessel increases the risk that it will pick up noise and interference from other system elements, and thereby pass said noise and interference into the input of the preamplifier. An alternative approach is to provide a common reference voltage to two separate differential amplifiers, each of which is located it its respective electric potential antenna. This reference voltage provides the second input to the preamplifier while the antenna electrode provides the first. The reference voltage is filtered at the preamplifier input to remove noise or interference picked up by the conductor that carries it. When the two antenna outputs are subtracted in the subsequent amplification or processing stages (See Equations 1 and 2), the reference voltage is removed from the subsequent electric field measurement. For convenience, the reference voltage can be transferred to the preamplifier via a separate insulated conductor within the cable 526.

Although described with reference to preferred embodiments of the invention, it should be readily understood that various changes and/or modifications can be made to the invention without departing from the spirit thereof. In general, the invention is only intended to be limited by the scope of the following claims.

We claim:

1. A system for measuring magnetic and electric fields present in an electrically conducting medium, the system comprising:
a group of components constituting an integrated sensor package including:
two magnetic sensors, each magnetic sensor having a magnetic field induction coil for producing a magnetic field signal and a magnetic field signal amplifier connected to the induction coil for producing an amplified magnetic field signal based on the magnetic field signal, each induction coil being disposed so as to measure fields in orthogonal directions;
two electric field sensors, each electric field sensor having an electric field signal amplifier connected to at least two electric potential antennas for producing an amplified electric field signal, each electric field sensor being disposed so as to measure fields in orthogonal directions, the at least two electric potential antennas each including a respective capacitive electrode being adapted to measure an electric potential and having a conducting core and an electrically insulative layer covering the core, said insulative layer preventing transfer of a resistive current from the core to the medium;
a data acquisition system for receiving the amplified electric field signals and the amplified magnetic field signals and storing data representative thereof; and
a power supply for providing electrical power to the data acquisition system, the electric sensors and the magnetic sensors.

2. The system according to claim 1, further comprising: magnetic source coils which create calibration magnetic fields that are measured by the field induction coils and conductors which create calibration electric fields that are measured by the electric potential antennas.

3. The system according to claim 1, further comprising: a magnetic field induction coil for measuring a component of the magnetic fields in a direction orthogonal to the two magnetic sensors.

4. The system according to claim 1, further comprising: a fifth electric potential antenna disposed above the electric potential antennas of the two electric field sensors so the electric fields in any direction can be determined.

5. The system according to claim 1, wherein the induction coils, the magnetic field signal amplifiers, the electric potential antennas, the electric field signal amplifiers, and the data acquisition system are integrated into a common pressure vessel.

6. The system according to claim 5, wherein a combination of two electric potential antennas, of the at least four electric potential antennas, and wiring between the two electrical potential antennas of the combination span the pressure vessel.

7. The system according to claim 5, further comprising: an orientation module including a magnetic compass is located inside the pressure vessel.

8. The system according to claim 1, wherein the respective capacitive electrode has a capacitance to the medium of greater than 1 mF.

9. The system according to claim 1, wherein the insulative layer is a metal oxide.

10. The system according to claim 1, wherein the electric field signal amplifier includes a preamplifier connected to a respective said electric potential antenna.

11. The system according to claim 1, wherein the electric field signal amplifier includes a preamplifier and an isolation stage prevents DC coupling of an output of the preamplifier from a downstream data recording stage, whereby a DC potential difference between each respective capacitive electrode and the medium is minimized in order to minimize electrochemical reactions at the respective capacitive electrodes.

12. The system according to claim 1, further comprising: an anchor for deploying the system to a seafloor and a flotation device for retrieving the system from the seafloor and the system is adapted to determine a resistivity of the seafloor to quantify hydrocarbon deposits.

13. The system according to claim 12, wherein the flotation device contains the group of components.

14. The system according to claim 1, further comprising: an antenna connected to the data acquisition system that receives commands and transmits data wirelessly to a receiver.

15. A method for measuring an electric field present in an electrically conducting medium below a surface of the medium comprising;
deploying electrodes on a rigid structure that provides a defined electrode separation;
preventing a transfer of a resistive current from the electrodes to the medium;
measuring either a differential signal from the electrode or a signal from each electrode;

producing an amplified electric field signal by either amplifying the differential signal from the electrodes or amplifying the signal from each electrode first and then taking the difference; and storing the amplified electric field signal.

16. The method of claim 15, wherein the electrically conducting medium is seawater and the electric field is measured below a surface of the seawater.

17. A method for measuring electric and magnetic fields present below a surface of a body of water comprising;

deploying a system including at least two electric field sensors, each field sensor having an electric field signal amplifier connected to at least two electric potential antennas, the at least two electric potential antennas each including a respective capacitive electrode, and magnetic field sensors, having at least two magnetic field induction coils, arranged in a plane under the water;

measuring the electric and magnetic fields in orthogonal directions to produce signals representative of the electric and magnetic fields;

preventing a transfer of a resistive current from at least one of the electrodes to the water;

amplifying the signals from the electric potential antennas and magnetic field induction coils to produce amplified electric field signals and amplified magnetic field signals, respectively; and storing the amplified electric field signals and amplified magnetic field signals.

18. The method according to claim 17, further comprising:

minimizing a DC potential difference between the electrodes and the water in order to minimize electrochemical noise at the electrodes.

19. The method according to claim 17, further comprising:

generating electromagnetic fields near at least one of the electric and magnetic field sensors; and confirming correct operation of the at least one of the electric and magnetic field sensors by using the generated electromagnetic fields.

20. The method according to claim 17, further comprising: keeping a single pressure vessel that houses the electric field sensors, the magnetic field sensors and a data acquisition system sealed at all times during shipborne deployment.

21. The method according to claim 17, further comprising: sending a command by an acoustic signal to start or stop operation of any component of the system or setting a system internal clock at a desired time.

22. The method according to claim 17, further comprising: sending data to the surface via a cable connected to a data acquisition system housed with the electric and magnetic field sensors.

23. The method according to claim 17, further comprising: determining a resistivity of a seafloor to quantify hydrocarbon deposits.

24. The method of claim 17, wherein the water is seawater.

* * * * *